(12) United States Patent
Eungyoon

(10) Patent No.: US 8,866,116 B2
(45) Date of Patent: Oct. 21, 2014

(54) SEMICONDUCTOR MEMORY DEVICES HAVING PREDETERMINED CONDUCTIVE METAL LEVELS AND METHODS OF FABRICATING THE SAME

(75) Inventor: Tae Eungyoon, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 265 days.

(21) Appl. No.: 13/351,054

(22) Filed: Jan. 16, 2012

(65) Prior Publication Data

US 2012/0187360 A1 Jul. 26, 2012

(30) Foreign Application Priority Data

Jan. 20, 2011 (KR) ........................ 10-2011-0005963

(51) Int. Cl.
*H01L 29/02* (2006.01)
*G11C 11/16* (2006.01)
*H01L 43/08* (2006.01)
*H01L 45/00* (2006.01)

(52) U.S. Cl.
CPC ............... *G11C 11/161* (2013.01); *H01L 43/08* (2013.01); *H01L 45/06* (2013.01); *H01L 45/141* (2013.01)
USPC ............................................. 257/2; 438/666

(58) Field of Classification Search
USPC .......... 257/43, 57, 2, 4, 5, 762, 744, E47.001; 438/104, 382, 151, 158, 30, 479, 49, 438/585
See application file for complete search history.

(56) References Cited

U.S. PATENT DOCUMENTS

| 7,427,531 | B2 | 9/2008 | Cho et al. |
| 7,541,252 | B2* | 6/2009 | Eun et al. ...................... 438/381 |
| 7,612,360 | B2 | 11/2009 | Lee et al. |
| 2007/0029676 | A1* | 2/2007 | Takaura et al. ............... 257/758 |
| 2008/0029754 | A1* | 2/2008 | Min et al. ........................... 257/4 |
| 2009/0045453 | A1* | 2/2009 | Heo ............................. 257/324 |
| 2009/0093097 | A1* | 4/2009 | Kim ............................. 438/275 |
| 2010/0314602 | A1* | 12/2010 | Takano et al. ...................... 257/4 |
| 2010/0320527 | A1* | 12/2010 | Okamura et al. ............. 257/324 |

FOREIGN PATENT DOCUMENTS

| JP | 2006-237605 | 9/2006 |
| JP | 2008-124475 | 5/2008 |
| KR | 1020060094424 | 8/2006 |
| KR | 100780964 | 11/2007 |
| KR | 100782496 | 11/2007 |

* cited by examiner

*Primary Examiner* — Julio J Maldonado
*Assistant Examiner* — Robert Bachner
(74) *Attorney, Agent, or Firm* — F. Chau & Associates, LLC

(57) ABSTRACT

A semiconductor memory device includes a lower wiring disposed on a first region of a substrate and a gate electrode disposed on a second region of the substrate. The lower wiring includes substantially the same conductive material as the gate electrode. A wiring-insulating layer is interposed between the lower wiring and the substrate, and a gate insulating layer is interposed between the gate electrode and the substrate. A diode is disposed on the lower wiring, and a variable resistance element is electrically coupled to the diode.

15 Claims, 39 Drawing Sheets

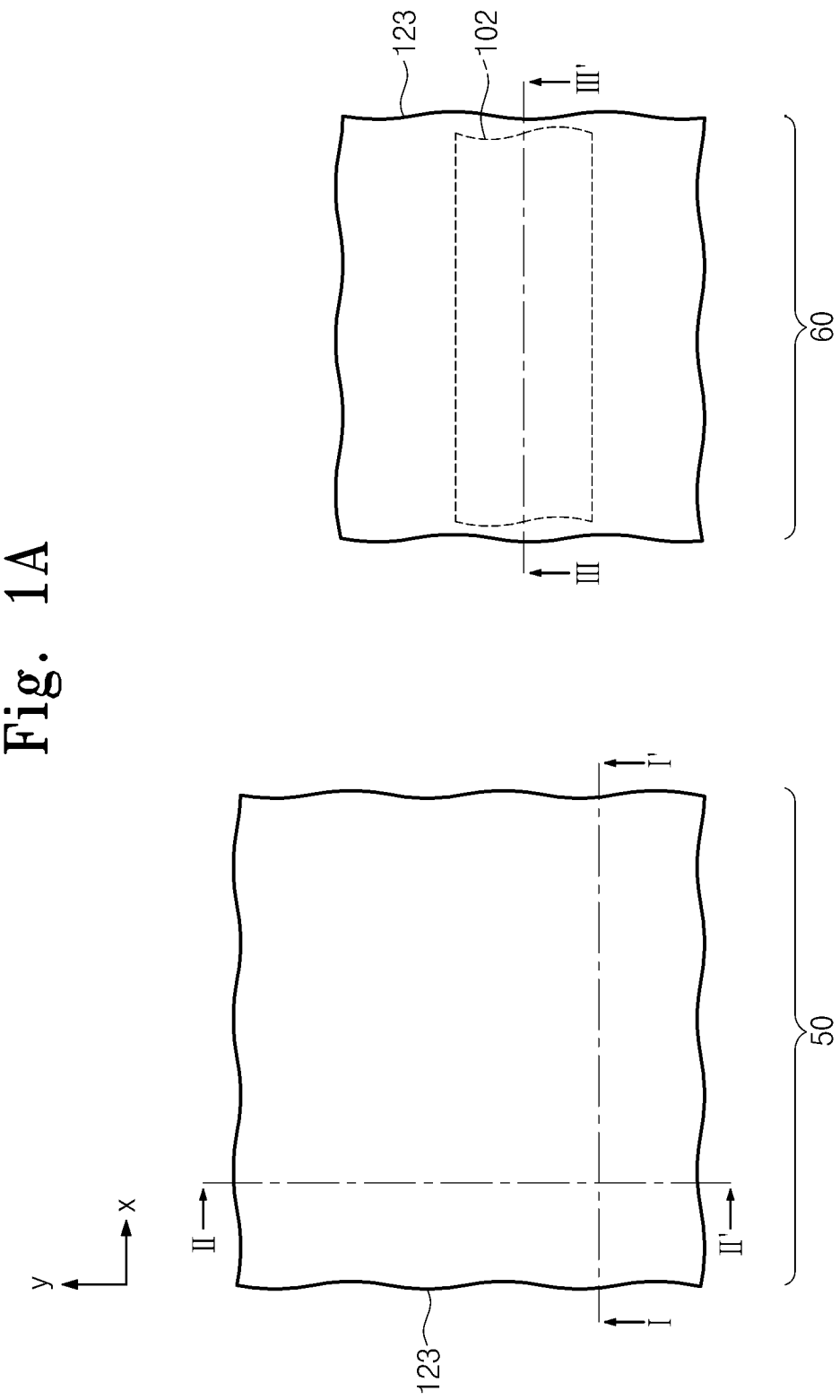

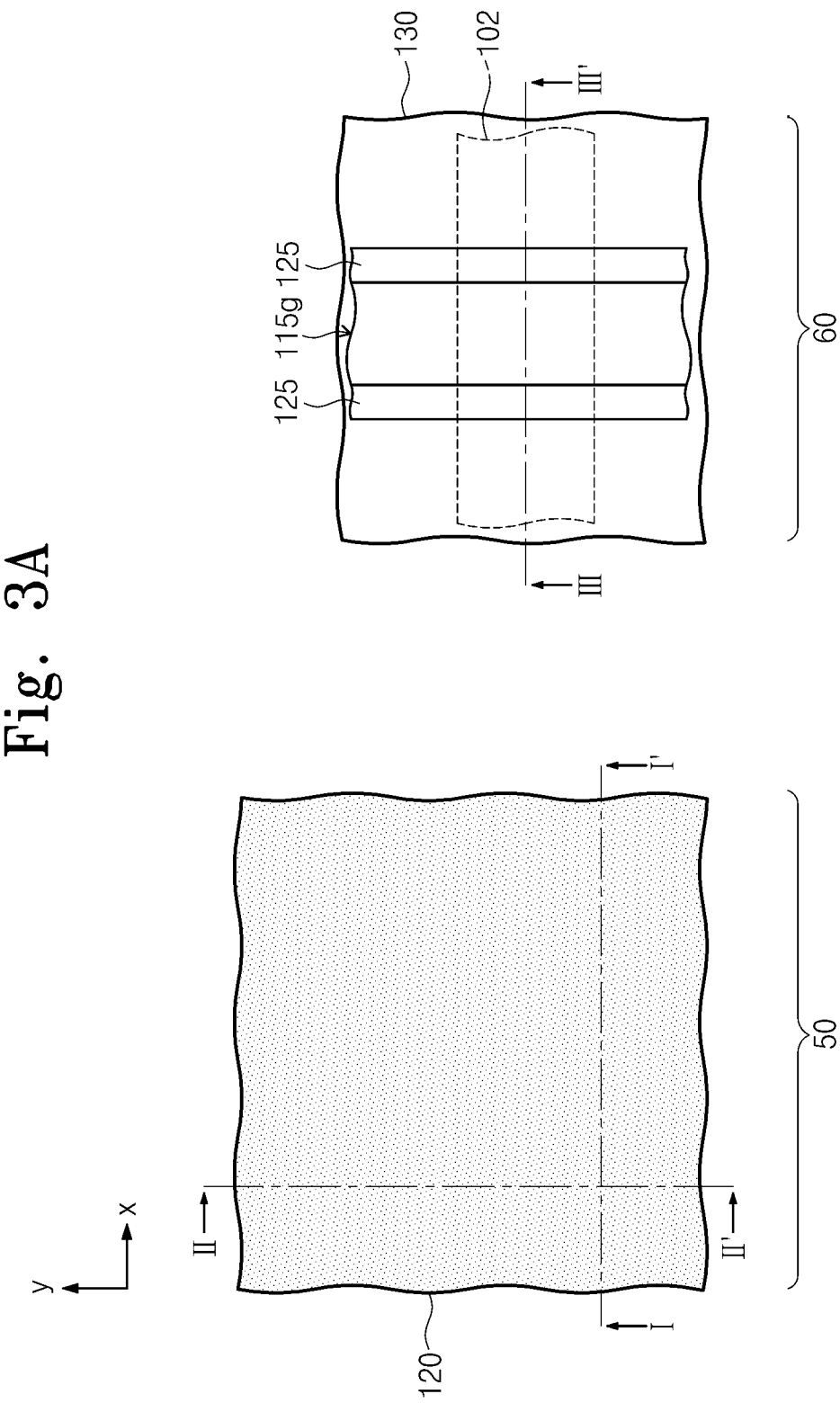

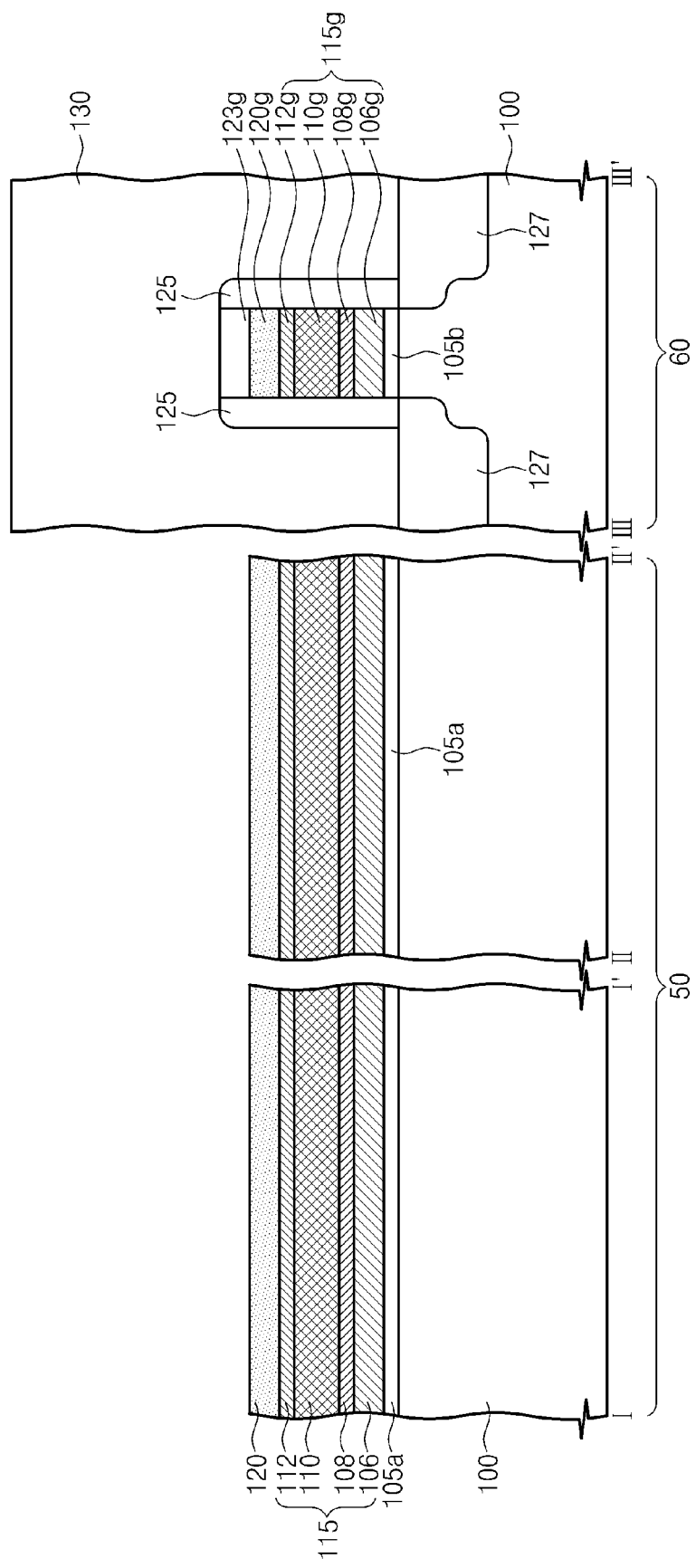

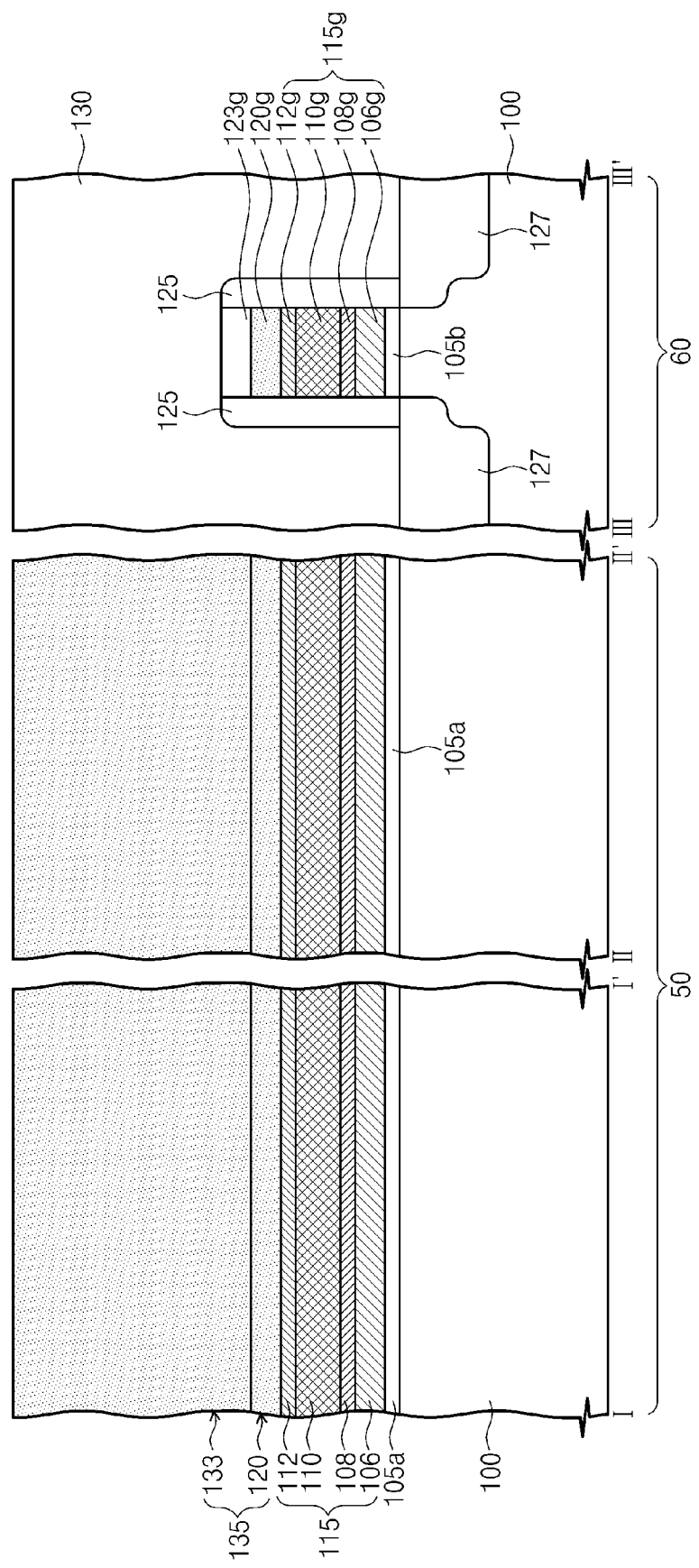

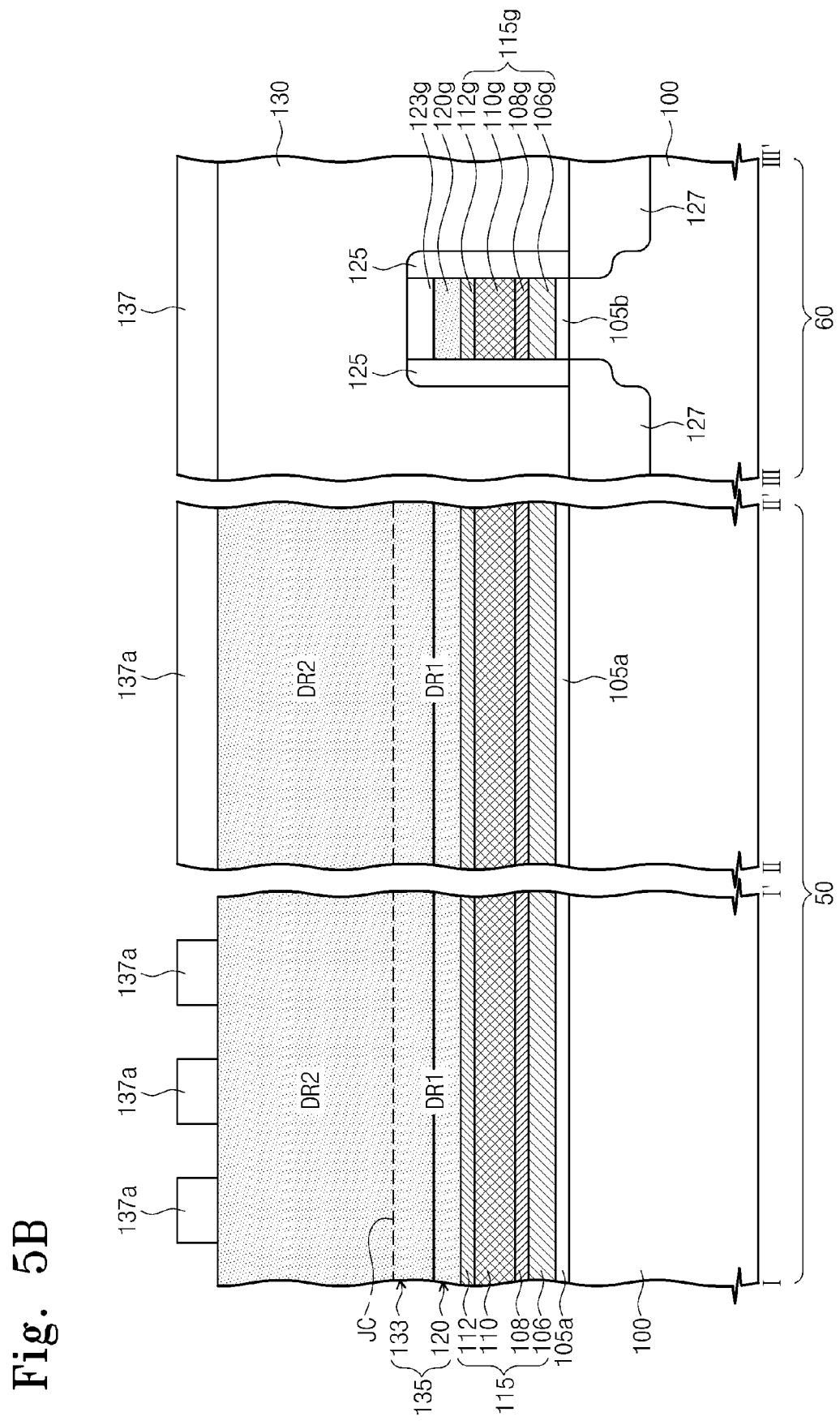

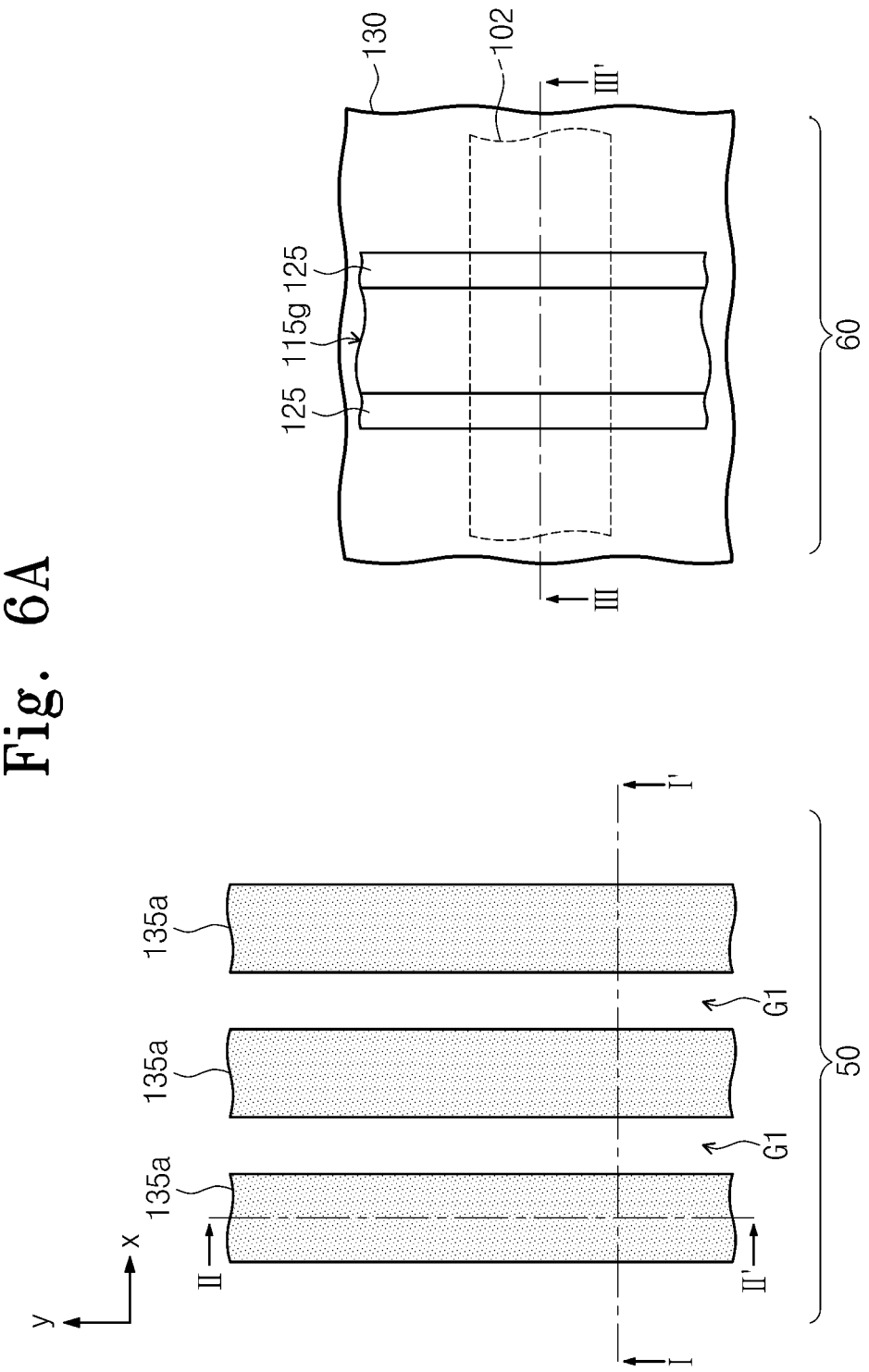

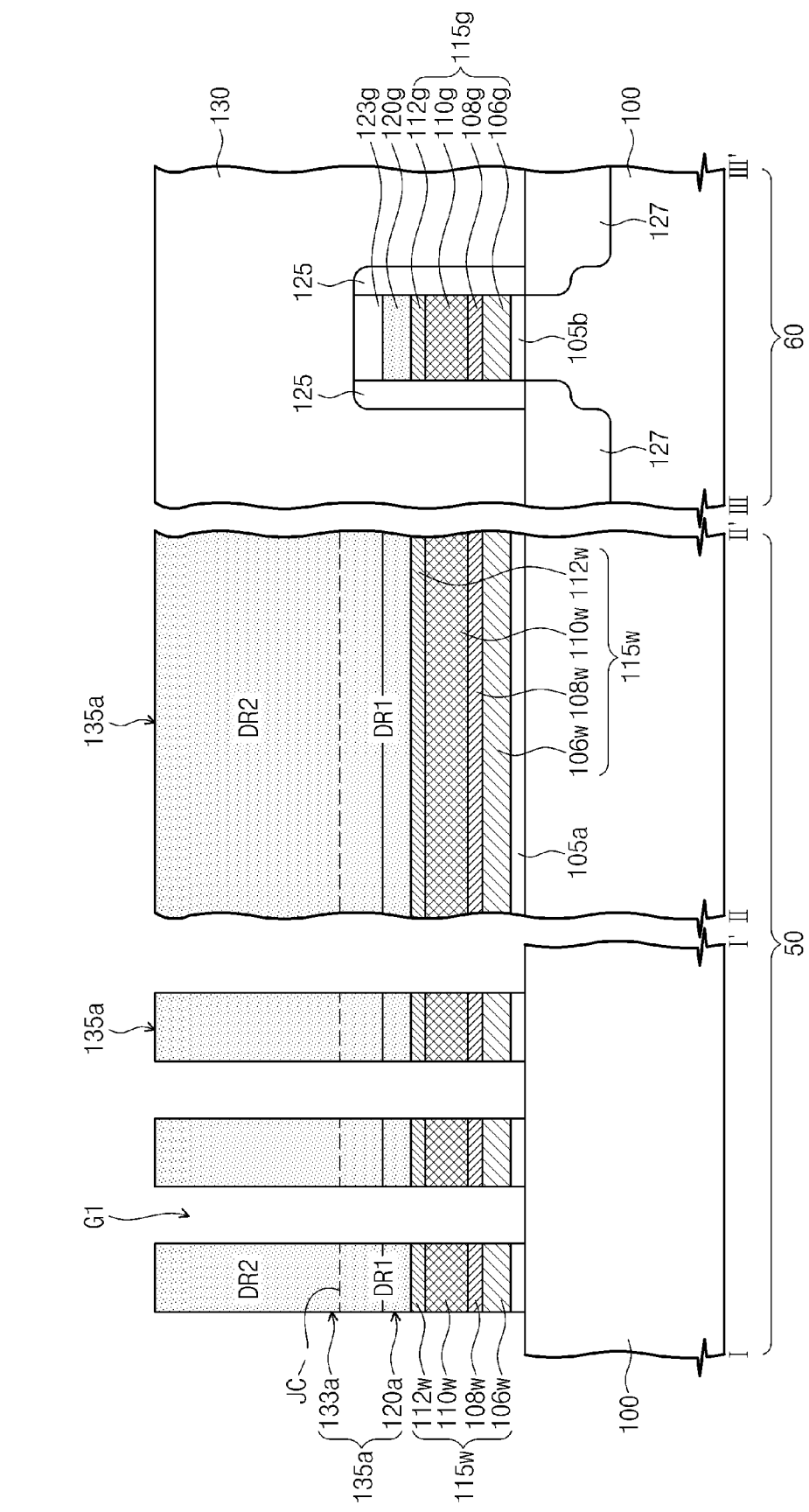

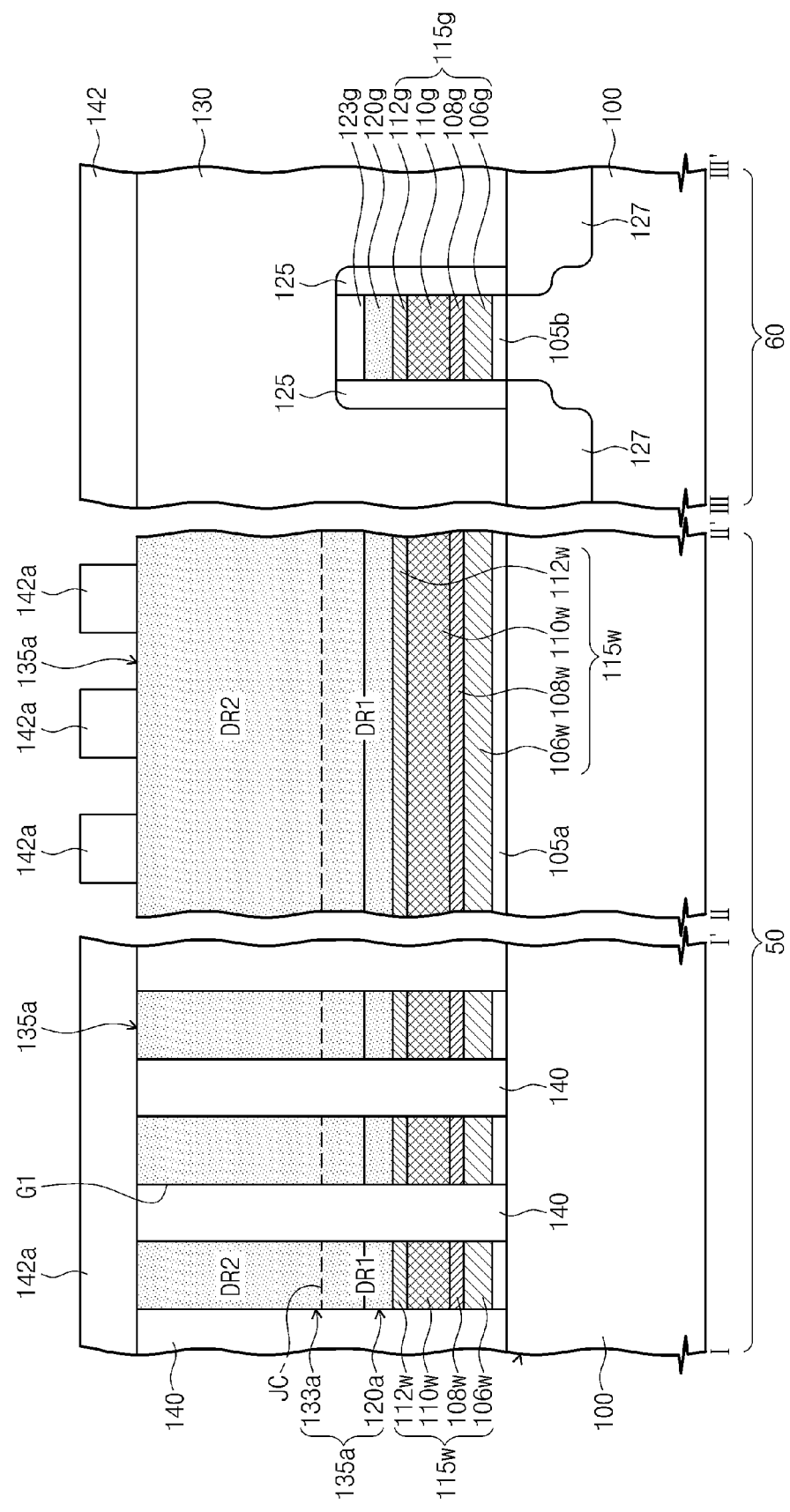

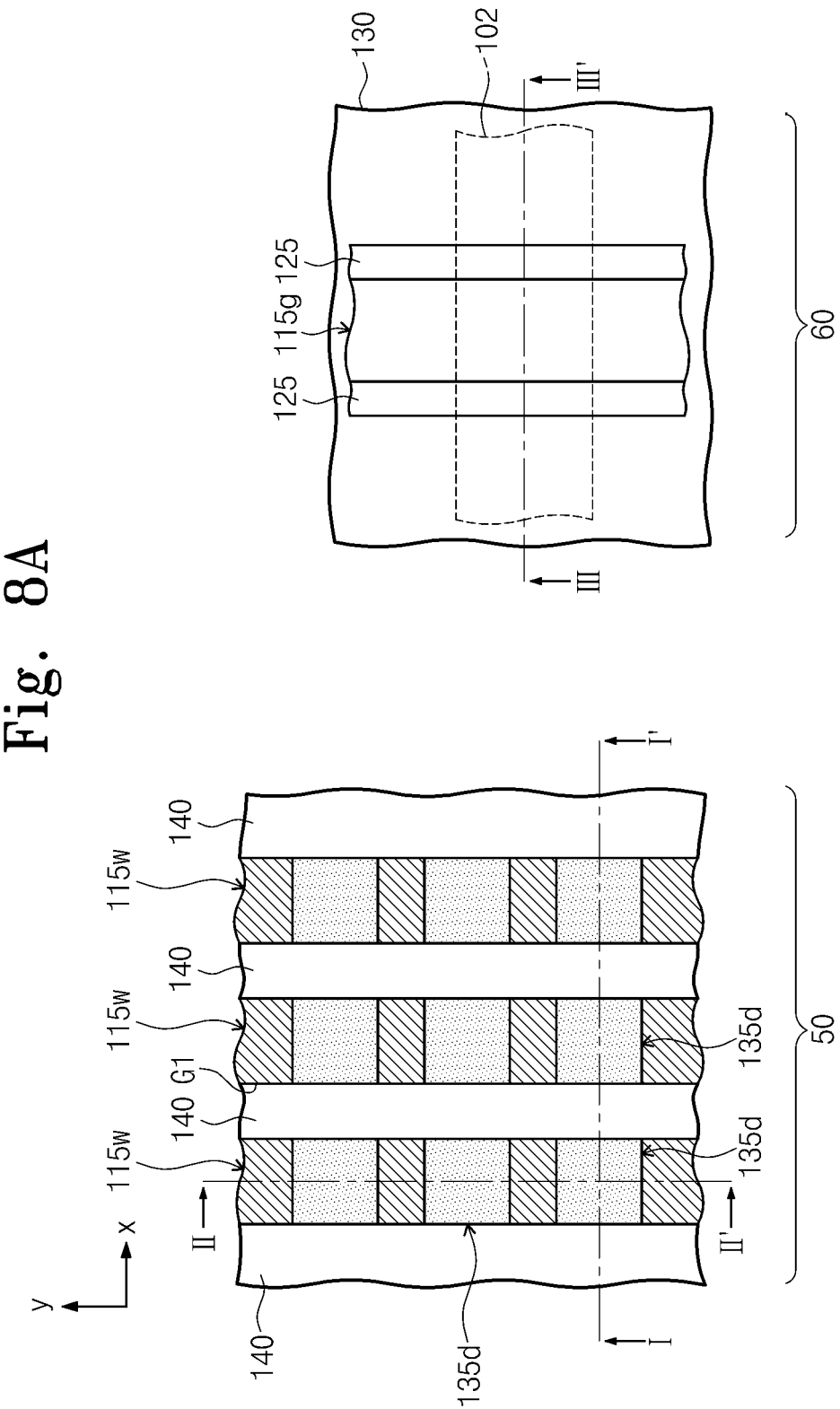

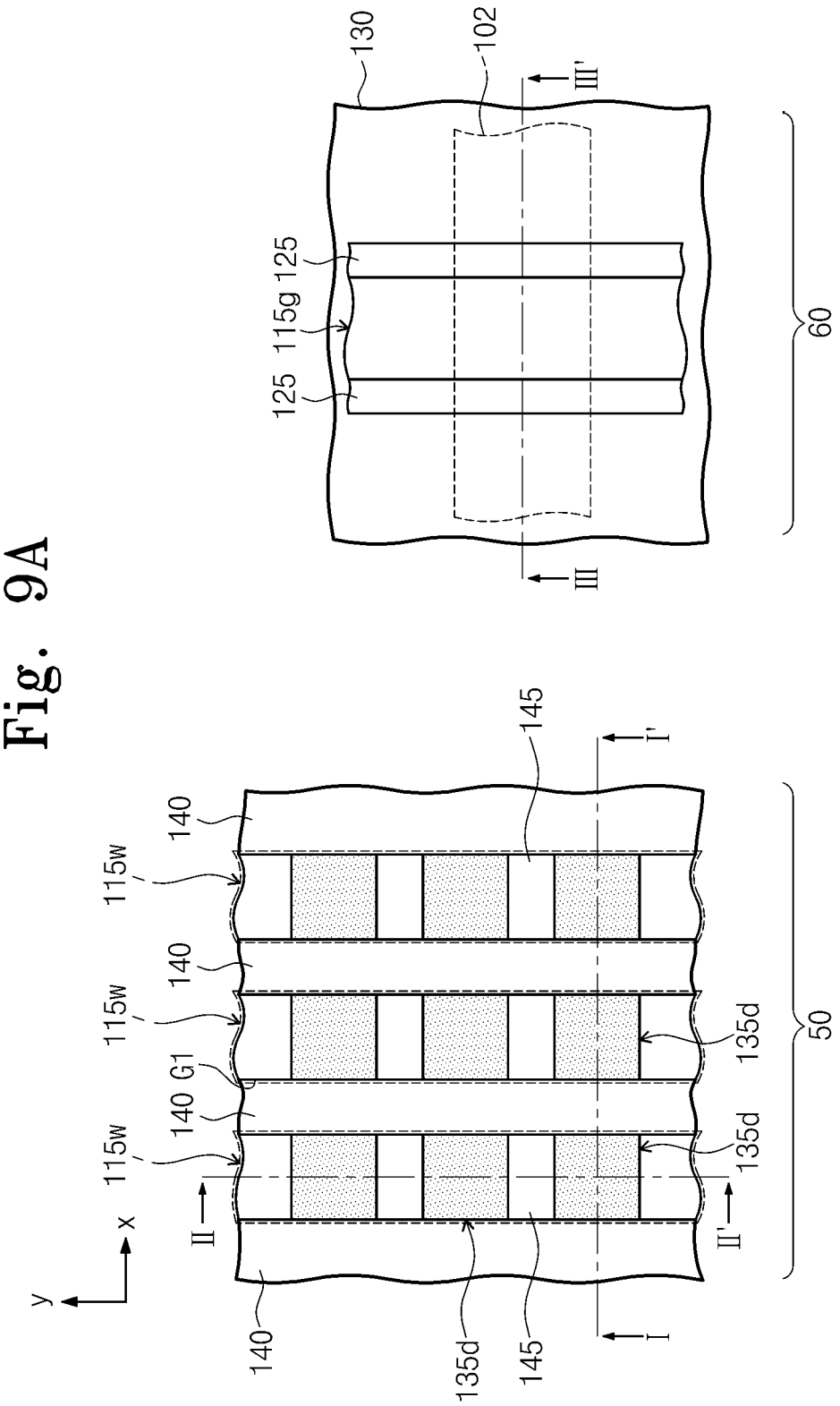

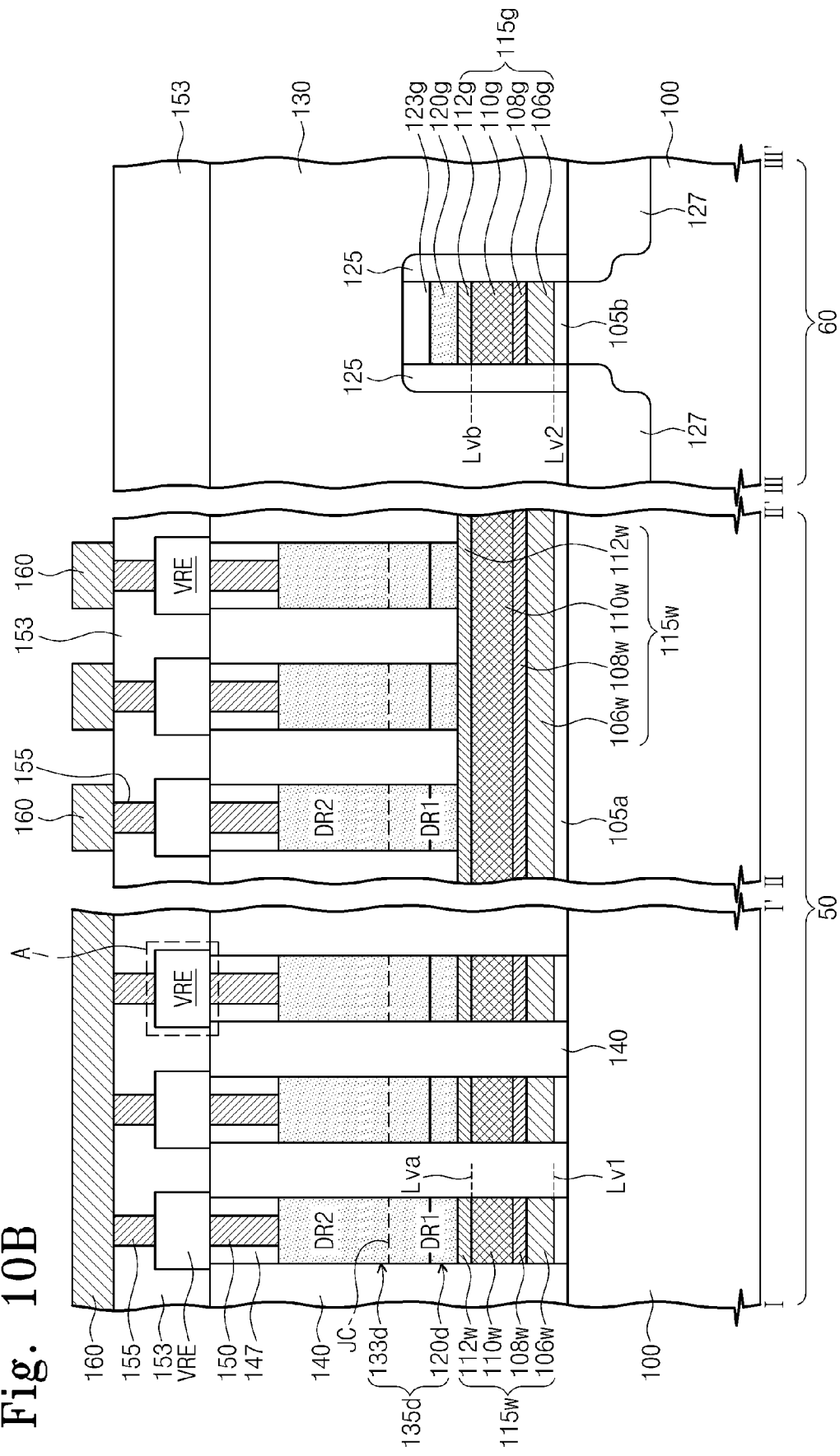

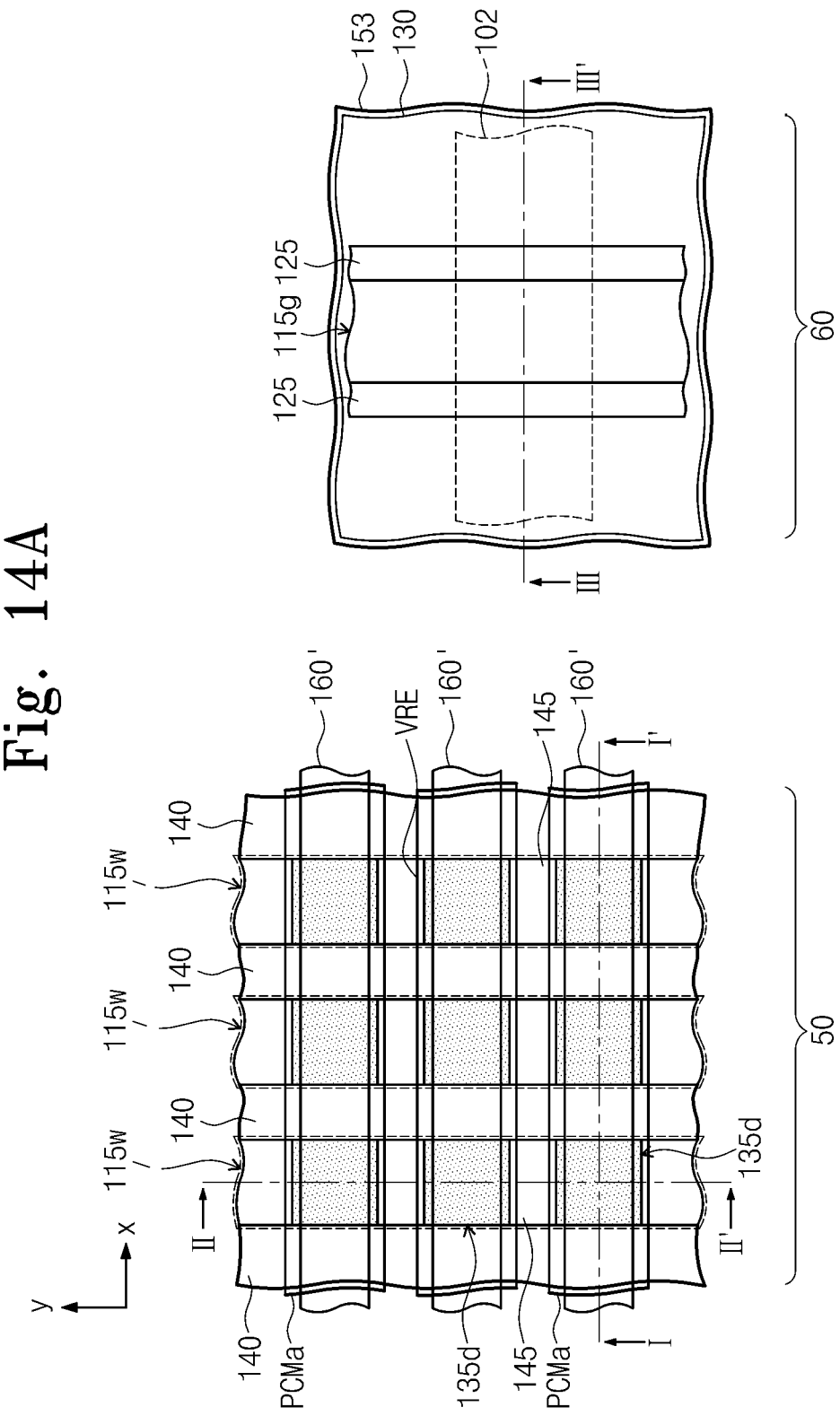

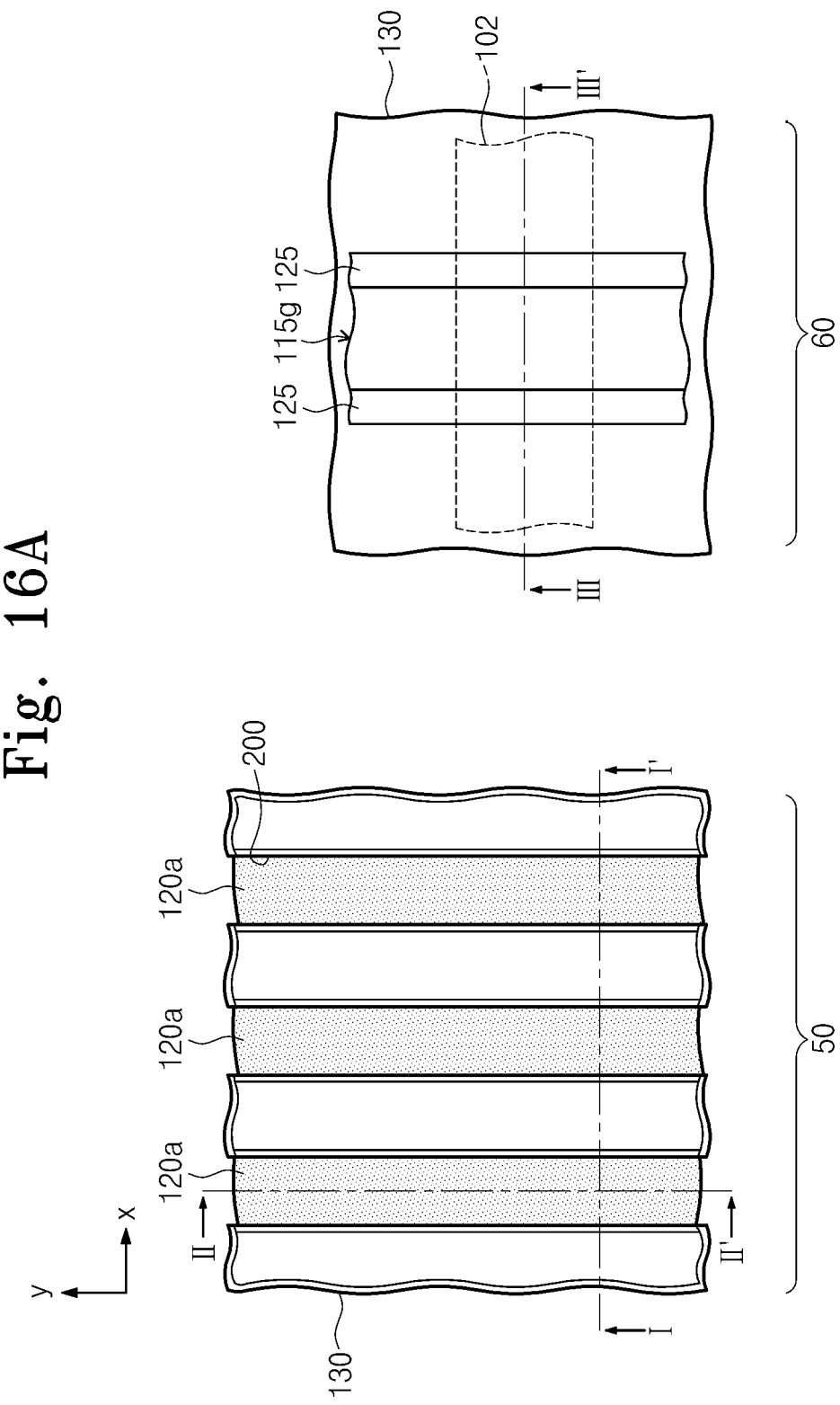

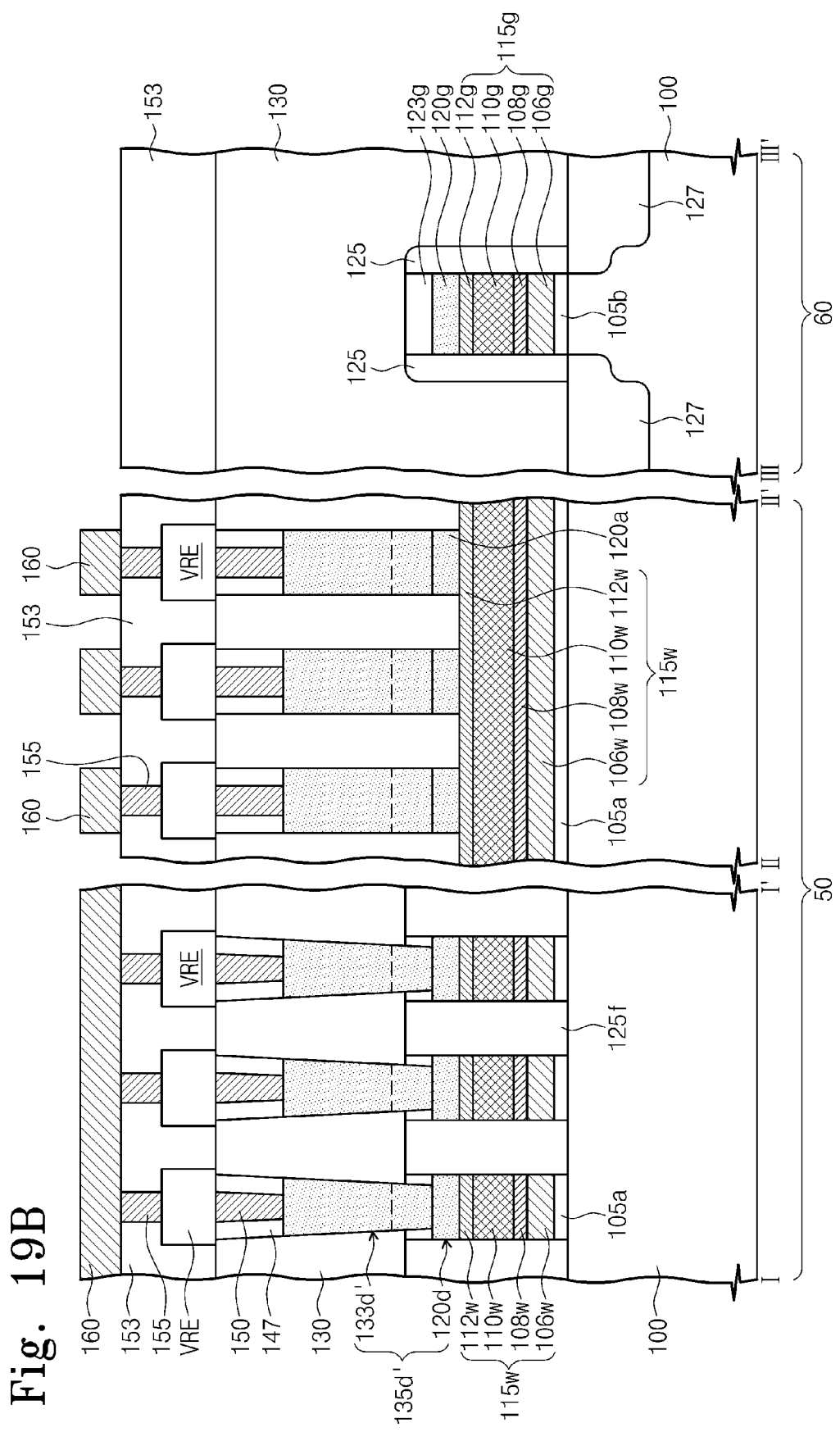

SEMICONDUCTOR MEMORY DEVICES HAVING PREDETERMINED CONDUCTIVE METAL LEVELS AND METHODS OF FABRICATING THE SAME

CROSS-REFERENCE TO RELATED APPLICATION

This U.S. non-provisional patent application claims under 35 U.S.C. §119 priority to and the benefit of Korean Patent Application No. 10-2011-0005963, filed on Jan. 20, 2011, in the Korean Intellectual Property Office, the entire content of which is incorporated by reference herein.

BACKGROUND

The present disclosure relates to semiconductor devices and methods of fabricating the same, and, more particularly, to semiconductor memory devices and the method of fabricating the same.

Due to their small-size, multifunctionality, and/or low-cost characteristics, semiconductor devices are considered important elements in the electronic industry. Some semiconductor devices may include a memory device for storing data, a logic device for processing data, and a hybrid device capable of performing various memory storage and data processing functions simultaneously.

Due to the increased demand for electronic devices with a fast speed and/or a low power consumption, the semiconductor memory device requires a fast read/write operating speed and a low operating voltage. Further, the semiconductor memory device needs high integration density, that is, more memory per area. However, there is a tradeoff between the integration density and the fast operating speed of the semiconductor memory device. For instance, due to the shrinkage of patterns, as the higher the integration density of the semiconductor memory device becomes, the slower the operating speed of the semiconductor memory device becomes.

SUMMARY

Exemplary embodiments of the inventive concepts provide semiconductor memory devices capable of realizing a fast operating speed and methods of fabricating the same.

Other exemplary embodiments of the inventive concepts provide semiconductor memory devices with an increased integration density and methods of fabricating the same.

According to an exemplary embodiment a semiconductor memory device includes a substrate including a first region and a second region, a lower wiring disposed on the substrate in the first region, a wiring-insulating layer interposed between the lower wiring and the substrate, a diode disposed on the lower wiring, a variable resistance element electrically coupled to the diode, a gate electrode disposed on the substrate in the second region, the lower wiring including substantially the same conductive material as the gate electrode, and a gate insulating layer interposed between the gate electrode and the substrate.

A bottom surface of the lower wiring may be located at substantially the same level as a bottom surface of the gate electrode.

The wiring-insulating layer may be formed of substantially the same material as the gate insulating layer.

The diode may include a seed portion and a bulk portion sequentially stacked, and a first doped region and a second doped region forming a PN junction. The first doped region of the diode may be formed in at least the seed portion coupled to the lower wiring.

The semiconductor memory device may further include a capping semiconductor pattern disposed on the gate electrode. The capping semiconductor pattern may include substantially the same semiconductor material as a semiconductor material included in the seed portion.

The gate electrode may include a metal gate, and the lower wiring may include a metal pattern having substantially the same metal as the metal gate.

A top surface of the metal pattern disposed under the diode may be located at substantially the same level as a top surface of the metal gate.

The gate electrode may further include a lower barrier gate interposed between the metal gate and gate insulating layer and an upper barrier gate disposed on the metal gate. The lower wiring may further include a lower barrier pattern interposed between the metal pattern and wiring-insulating layer and an upper barrier pattern disposed on the metal pattern. The lower barrier gate may be formed of substantially the same material as the lower barrier pattern, and the upper barrier gate is formed of substantially the same material as the upper barrier pattern.

The diode may have a tetragonal top surface when viewed from a plan view.

The diode may have both sidewalls self-aligned with both sidewalls of the lower wiring, respectively.

The semiconductor memory device may further include an upper wiring electrically coupled to a top surface of the variable resistance element and crossing the lower wiring.

According to an exemplary embodiment, a method of fabricating a semiconductor memory device, includes preparing a substrate comprising a first region and a second region, forming a wiring-insulating layer on the first region of the substrate, forming a gate insulating layer on the second region of the substrate, forming a gate conductive layer on the entire top surface of the substrate, patterning the gate conductive layer in the second region to form a gate electrode in the second region, patterning the gate conductive layer in the first region to form a lower wiring in the first region, forming a diode on the lower wiring, and forming a variable resistance element electrically coupled to the diode in the first region.

The forming of the diode on the lower wiring may include forming a seed layer on the gate conductive layer, forming a bulk layer on the seed layer in the first region, successively patterning the bulk layer, the seed layer and the gate conductive layer to form the lower wiring, a seed line pattern and a bulk line pattern sequentially stacked, and successively patterning the bulk line pattern and the seed line pattern to form the diode.

The forming of the gate electrode may include successively patterning the seed layer and the gate conductive layer in the second region to form the gate electrode and a capping semiconductor pattern sequentially stacked, before the forming of the bulk layer, the method may further include forming an interlayer dielectric on the entire top surface of the substrate, and removing the interlayer dielectric in the first region to expose the seed layer in the first region and to remain the interlayer dielectric in the second region.

The forming of the gate electrode, the lower wiring and the diode may include forming a seed layer on the gate conductive layer, successively patterning the seed layer and the gate conductive layer in the second region to form the gate electrode and a capping semiconductor pattern sequentially stacked in the second region, successively patterning the seed layer and the gate conductive layer in the first region to form the lower wiring and a seed line pattern sequentially stacked in the first region, forming an interlayer dielectric on the entire top surface of the substrate, patterning the interlayer dielectric in the first region to form a groove exposing the seed line pattern, forming a bulk line pattern in the groove, and successively patterning the bulk line pattern and the seed line pattern to form the diode.

According to an exemplary embodiment a semiconductor memory device includes a transistor region formed on a semiconductor substrate and a memory cell region formed on the semiconductor substrate. The transistor region includes a gate electrode having a gate conductive layer disposed at a predetermined level from the semiconductor substrate. The memory cell region includes a plurality of lower wirings spaced apart from each other, each of the lower wirings extending in a first direction, having substantially the same material as the gate conductive layer and disposed at the predetermined level from the semiconductor susbtrate. A plurality of diodes is on each of the lower wirings, each diode spaced apart from an adjacent diode in the first direction on a respective lower wiring. A lower contact plug is on each of the diodes. A variable resistance element is on each lower contact plug. An upper contact plug is on each variable resistance element. A plurality of upper wirings are spaced apart from each other, each of the upper wirings extending in a second direction substantially perpendicular to the first direction and contacting one of the upper contact plugs associated with each of the lower wirings, such that a variable resistance element and associated diode form a memory cell at a plan view intersection of an upper wiring and a lower wiring.

The gate conductive layer and the lower wirings both may include a first barrier layer, a metal layer, and a second barrier layer sequentially stacked, the metal layer comprising a metal having a low resistivity, the first barrier layer comprising conductive material configured to prevent metal atoms in the metal layer from diffusing toward the semiconductor substrate, the second barrier layer comprising a conductive material configured to prevent metal atoms in the metal layer from diffusing away from the semiconductor substrate.

Each diode may include a first doping region in contact with a respective lower wiring layer and doped with dopants of a first conductivity type and a second doping region stacked on the first doping region and doped with dopants of a second conductive type. The first dopant region and the second dopant region may form a diode PN junction.

Each diode may enlargingly taper from an end of the first doping region in contact with the lower wiring layer to an end of the second doping region distal from the first doping region.

The variable resistance element may include a variable resistance material whose resistance or crystalline structure can be reversibly changed by a signal applied to the variable resistance element such that the variable resistance element stores logical data.

BRIEF DESCRIPTION OF THE DRAWINGS

FIGS. 1A, 2A, 3A, 4A, 5A, 6A, 7A, 8A and 9A are plan views illustrating methods of fabricating a semiconductor memory device according to exemplary embodiments of the inventive concepts.

FIGS. 1B, 2B, 3B, 4B, 5B, 6B, 7B, 8B and 9B are sectional views taken along lines I-I', II-II' and III-III' of FIGS. 1A, 2A, 3A, 4A, 5A, 6A, 7A, 8A and 9A, respectively.

FIG. 10B is a sectional view taken along lines I-I', II-II' and III-III' of FIG. 10A;

FIG. 14A is a plan view illustrating a variable resistance element according to yet other exemplary embodiments of the inventive concepts.

FIGS. 15A, 16A, 17A and 18A are plan views illustrating methods of fabricating a semiconductor memory device according to exemplary embodiments of the inventive concepts.

FIG. 19B a sectional view taken along lines I-I', II-II' and III' of FIG. 19A.

Figure 1B:
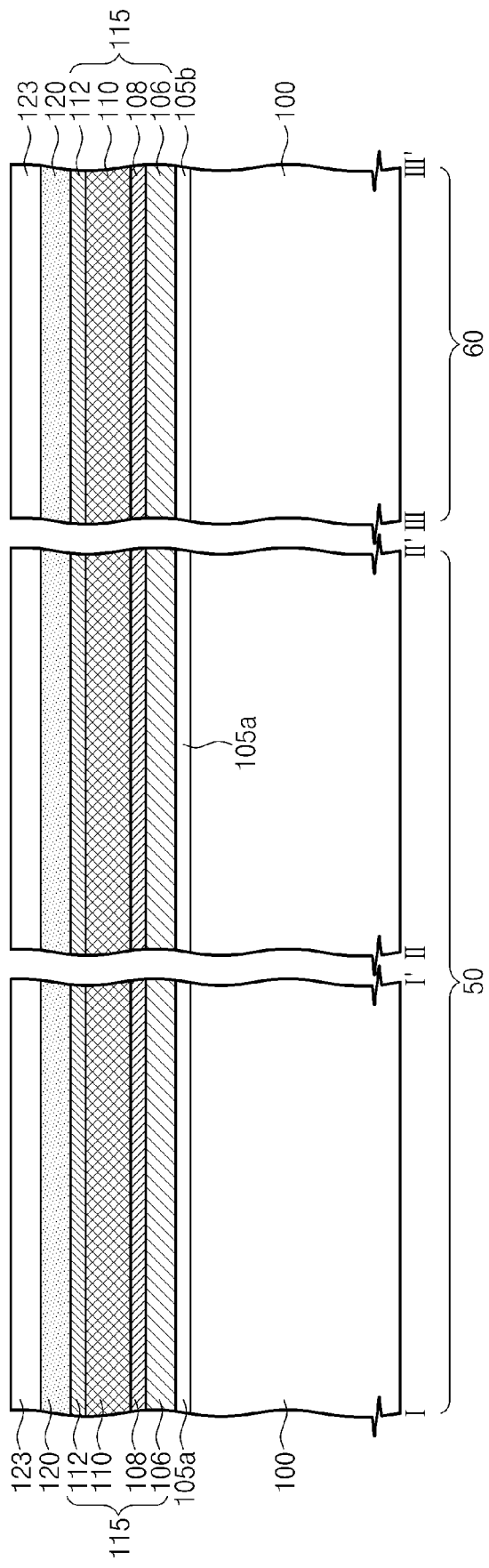

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by the exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Exemplary embodiments of the inventive concepts will now be described more fully with reference to the accompanying drawings in which the thicknesses of layers and regions may be exaggerated for clarity. Like reference numerals in the drawings denote like elements.

It will be understood that when an element is referred to as being "connected" or "coupled" to another element, it can be directly connected or coupled to the other element or intervening elements may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Exemplary embodiments of the inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

FIGS. 1A through 9A are plan views illustrating methods of fabricating a semiconductor memory device according to exemplary embodiments of the inventive concepts, and FIGS. 1B through 9B are sectional views taken along lines I-I', II-II' and of FIGS. 1A through 9A, respectively.

Referring to FIGS. 1A and 1B, a semiconductor substrate 100 (hereinafter, a substrate) including a first region 50 and a second region 60 may be provided. The first region 50 may correspond to a cell region where memory cells will be formed, and the second region 60 may correspond to a region where a transistor will be formed. For instance, the second region 60 may correspond to a region (e.g., peripheral circuit region) where a peripheral circuit including transistors will be formed.

As shown in FIG. 1A, a device isolation pattern may be formed in the substrate 100 to define an active region 102 in the second region 60. The active region 102 may be a portion of the substrate 100 in the second region 60 that is surrounded by the device isolation pattern. In an exemplary embodiment, the device isolation pattern may not be formed in the first region 50, but exemplary embodiments of the inventive concepts may not be limited thereto.

A wiring-insulating layer 105a may be formed on the substrate 100 in the first region 50. A gate insulating layer 105b may be formed on the active region 102a of the second region 60. In an exemplary embodiment, the wiring-insulating layer 105a may be formed of substantially the same material as the gate insulating layer 105b. Furthermore, the wiring-insulating layer 105a and a gate insulating layer 105b may be formed simultaneously. Thus, the wiring-insulating layer 105a may have substantially the same thickness as that of the gate insulating layer 105b. In an exemplary embodiment, the gate insulating layer 105b may include at least one of an oxide layer, a nitride layer or an oxynitride layer.

A gate conductive layer 115 may be formed on the substrate 100 having the wiring-insulating layer 105a and the gate insulating layer 105b. In an exemplary embodiment, the gate conductive layer 115 may include a metal layer 110. The gate conductive layer 115 may include a base conductive layer 106, a first barrier layer 108, the metal layer 110 and a second barrier layer 112 sequentially stacked. The base conductive layer 106 may be formed of a conductive material capable of controlling a work function (i.e., minimum energy to remove an electron) of a gate electrode, which will be formed in the second region 60. The base conductive layer 106 may be formed of a doped semiconductor layer. The work function of the base conductive layer 106 may be controlled by adjusting the concentration and/or species of dopant atoms injected into the base conductive layer 106. In an exemplary embodiment, the base conductive layer 106 may be formed of at least one of doped silicon, doped germanium or doped silicon-germanium.

The metal layer 110 may include a metal having a low resistivity. The metal layer 110 may be formed of tungsten or aluminum. The first barrier layer 108 may include a conductive material capable of preventing metal atoms in the metal layer 110 from diffusing into the base conductive layer 106, the gate insulating layer 105b and/or the wiring-insulating layer 105a. The first barrier layer 108 may include a first conductive metal nitride layer, which may be formed of, for example, titanium nitride, tantalum nitride or tungsten nitride. In addition, the first barrier layer 108 may further include a first transition metal layer, which may be formed of, for example, titanium or tantalum, between the first conductive metal nitride and the base conductive layer 106. The second barrier layer 112 may include a conductive material capable of preventing metal atoms in the metal layer 110 from diffusing upwardly into layers thereon. The second barrier layer 112 may include a second conductive metal nitride layer, which may be formed of, for instance, titanium nitride, tantalum nitride or tungsten nitride. In addition, the second barrier layer 112 may further include a second transition metal layer, which may be formed of for instance, titanium or tantalum, between the second conductive metal nitride and the metal layer 110. The first barrier layer 108 may be formed of substantially the same material as the second barrier layer 112. Alternatively, the first barrier layer 108 may include a material different from the second barrier layer 112.

In other embodiments, the gate conductive layer 115 may be formed without the base conductive layer 106. That is, the first barrier layer 108 in the gate conductive layer 115 may be directly formed on the gate insulating layer 105b. In this case, electrical properties of the transistor, which will be formed in the second region 60, may be controlled by adjusting the work function of the first barrier layer 108.

A seed layer 120 may be formed on the gate conductive layer 115. The seed layer 120 may be in contact with the second barrier layer 112. The seed layer 120 may include a semiconductor layer. For instance, the seed layer 120 may include silicon, germanium or silicon-germanium. The seed layer 120 may be in a crystalline state. In an exemplary embodiment, the seed layer 120 may be in a poly-crystalline state. The seed layer 120 may be formed using a chemical vapor deposition process. The seed layer 120 may be doped with dopants of a first conductivity type using an in-situ doping method. Alternatively, the seed layer 120 may be in an un-doped state.

A capping insulating layer 123 may be formed on the seed layer 120. The capping insulating layer 123 may be formed of an insulating material capable of serving as an etch stop layer. For instance, the capping insulating layer 123 may be formed of nitride and/or oxynitride.

Figure 2A:
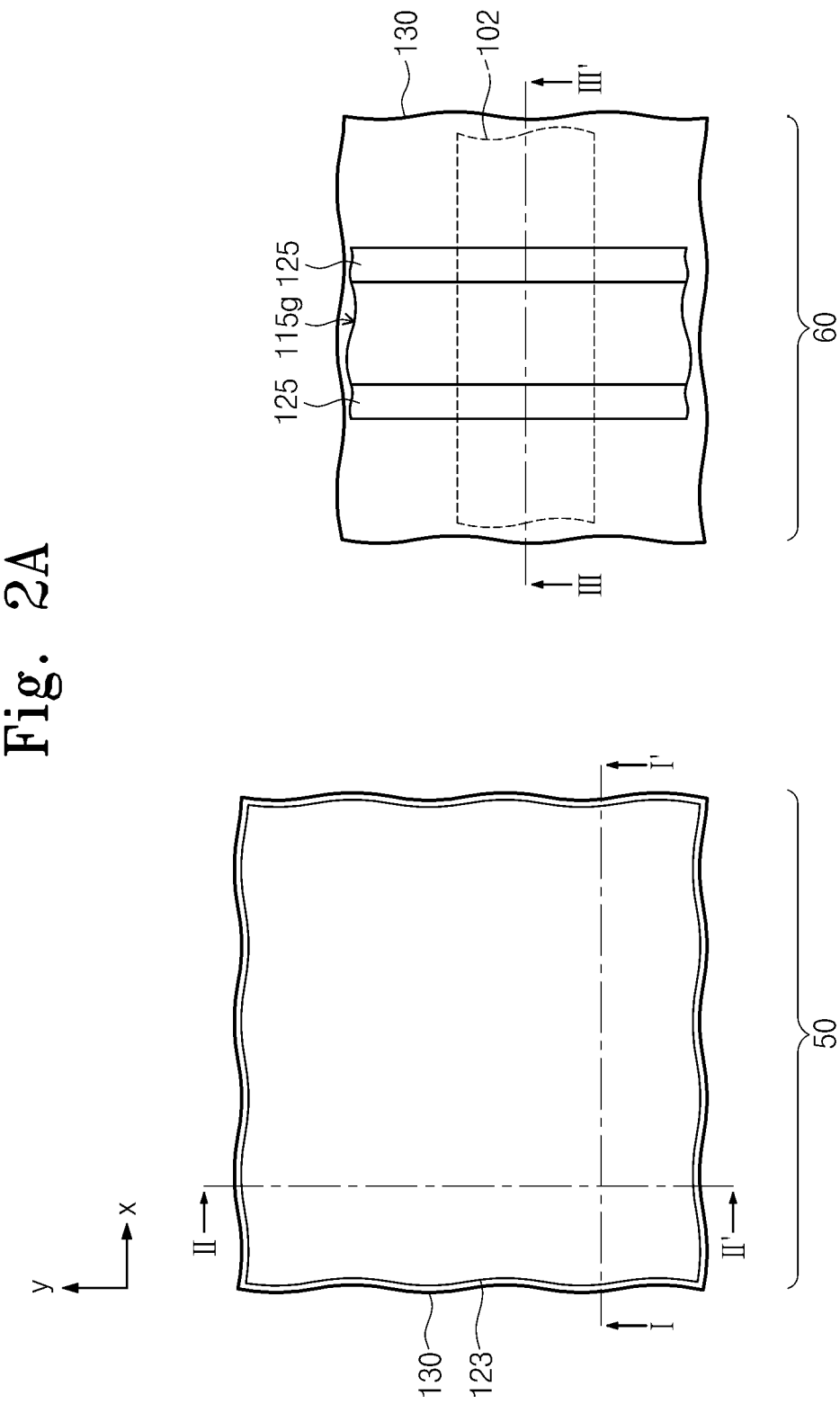
Figure 2B:
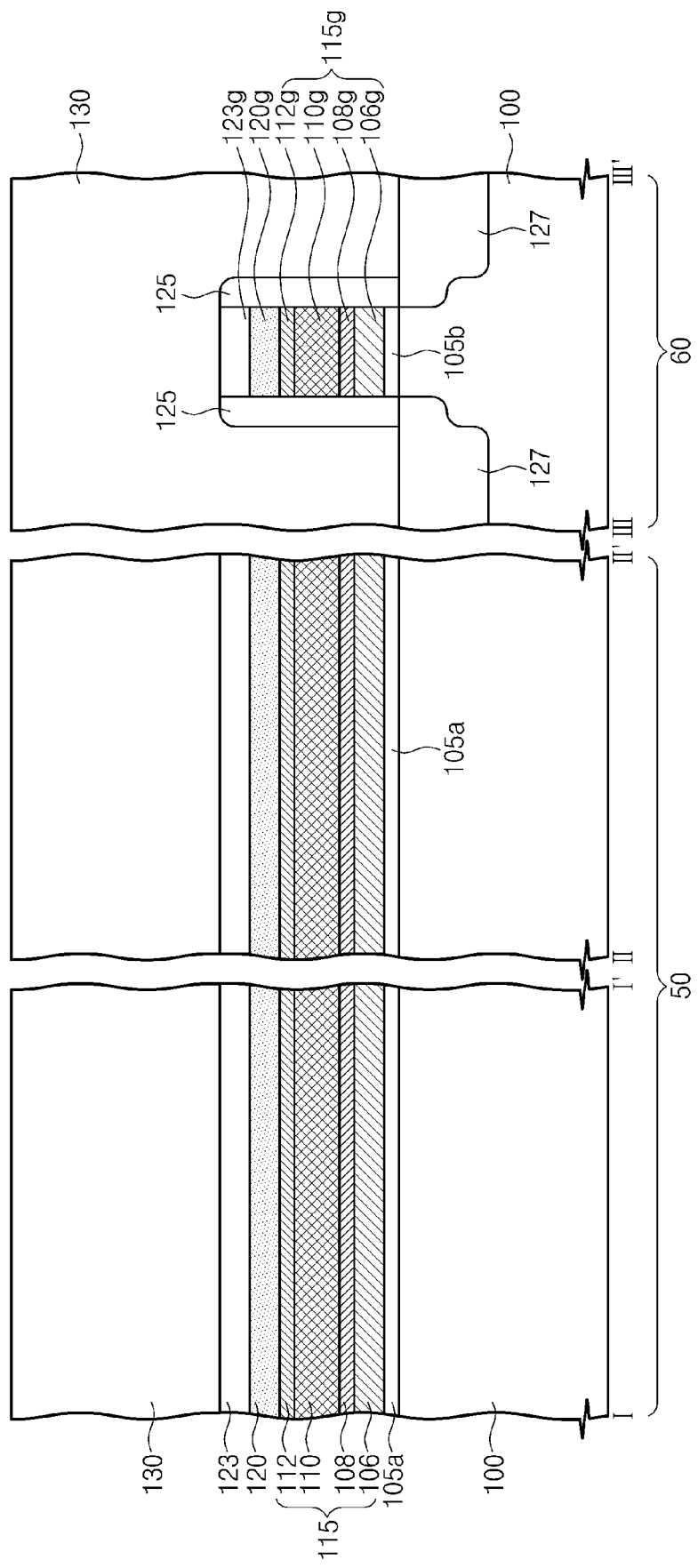

Referring to FIGS. 2A and 2B, the capping insulating layer 123, the seed layer 120 and the gate conductive layer 115 in the second region 60 may be successively patterned to form a gate electrode 115g, a capping semiconductor pattern 120g and a gate capping insulating pattern 123g, which are sequentially stacked on the second region 60. Here, the capping insulating layer 123, the seed layer 120, and the gate conductive layer 115 in the first region 50 may remain. The gate electrode 115g may include a base gate 106g, a first barrier gate 108g, a metal gate 110g, and a second barrier gate 112g sequentially stacked on the substrate 10 in the second region 60. In the case that the gate conductive layer 115 may not include the base conductive layer 106, the gate electrode 115g may not include the base gate 106g. The capping semiconductor pattern 120g may correspond to a portion of the seed layer 120.

Source/drain regions 127 may be formed in the active region 102 at both sides of the gate electrode 115g. Gate spacers 125 may be formed on both sidewalls of the gate electrode 115g, and the formation of the gate spacers 124 may include conformally forming a spacer layer on the substrate 100, and etching the spacer layer in an etch-back process. The spacer layer in the first region 50 may be removed during the etch-back process of the spacer layer. The source/drain region 127 may be formed to have a lightly doped drain (LDD) structure using the gate spacer 125. The LDD structure permits operation with a higher source-drain voltage as needed.

Thereafter, an interlayer dielectric 130 may be formed over an entire surface of the substrate 100. The interlayer dielectric 130 may include an oxide layer.

Referring to FIGS. 3A and 3B, the interlayer dielectric 130 may be selectively removed to expose the capping insulating layer 123 in the first region 50. Here, the interlayer dielectric 130 in the second region 60 may remain. The capping insulating layer 123 may serve as an etch stop layer during the selective removal of the interlayer dielectric 130. Thereafter, the exposed capping insulating layer 123 in the first region 50 may be removed to expose the seed layer 120 in the first region 50. In this case, the interlayer dielectric 130 in the second region 60 may still remain.

Figure 4A:
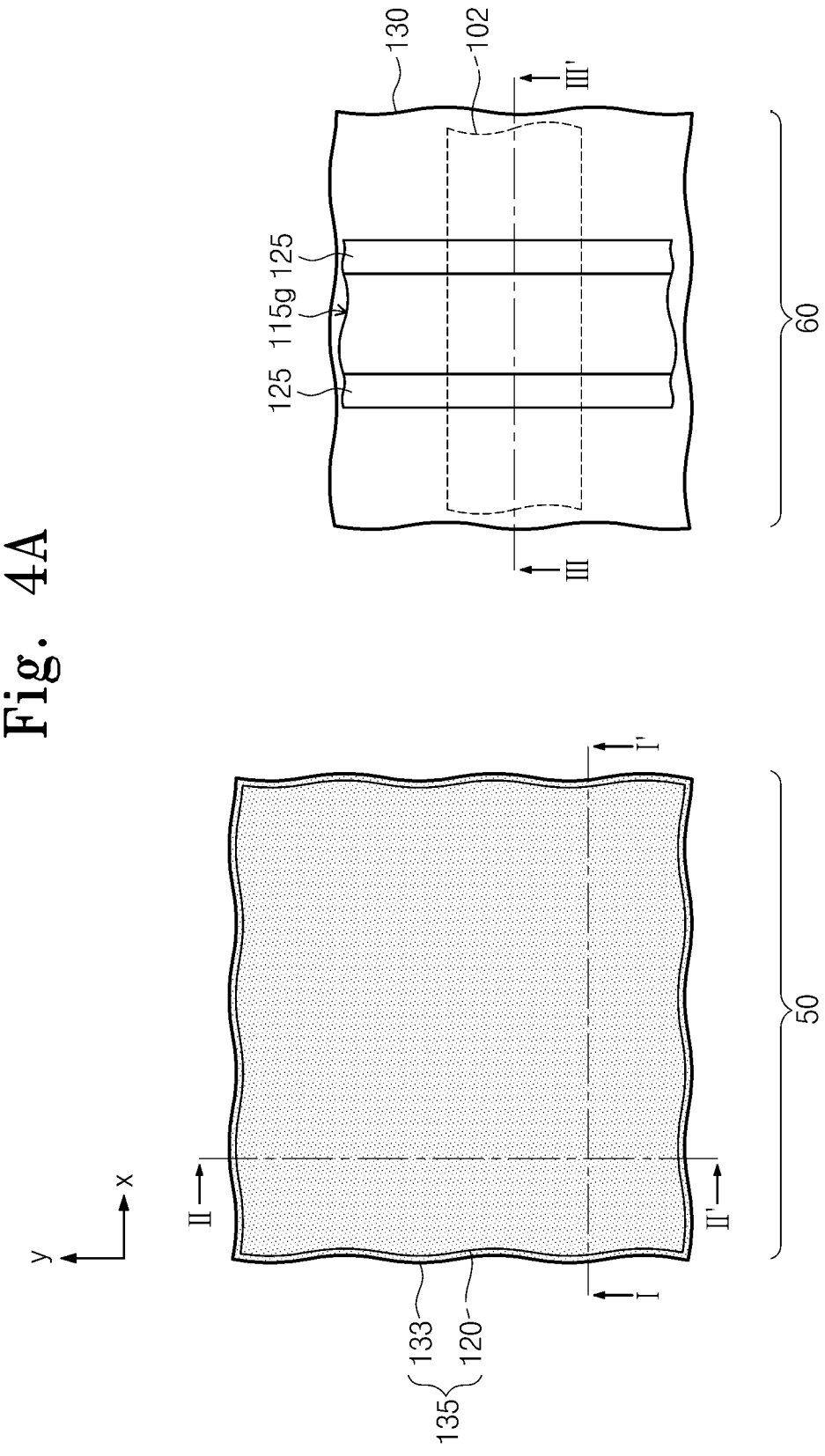

Referring to FIGS. 4A and 4B, a bulk layer 133 may be formed on the exposed seed layer 120 in the first region 50. The bulk layer 133 may include a semiconductor layer, which may be formed of substantially the same material as the seed layer 120. The bulk layer 133 may be formed by a selective epitaxial growth (SEG) process using the seed layer 120 as a seed. The bulk layer 133 may have substantially the same crystalline structure as the seed layer 120 by the SEG process. In an exemplary embodiment, the bulk layer 133 may be in a polycrystalline state. Due to the SEG process, the bulk layer 133 may not be formed on the interlayer dielectric 130 of the second region 60.

Alternatively, the bulk layer 133 may be formed using an amorphous semiconductor layer. The amorphous semiconductor layer may be formed on the substrate 100. The amorphous semiconductor layer may be in contact with the exposed seed layer 120. The amorphous semiconductor layer may be planarized until the interlayer dielectric 130 in the second region 60 is exposed. A laser beam may be irradiated onto the planarized amorphous semiconductor layer. The irradiation of the laser beam may be performed to heat the amorphous semiconductor layer up to a temperature above a melting point thereof. Then, during a subsequent cooling step, the amorphous semiconductor layer may be changed to have the same crystalline structure as the seed layer 120. The seed layer 120 and the bulk layer 133 stacked in the first region 50 may constitute a semiconductor layer 135.

Figure 5A:
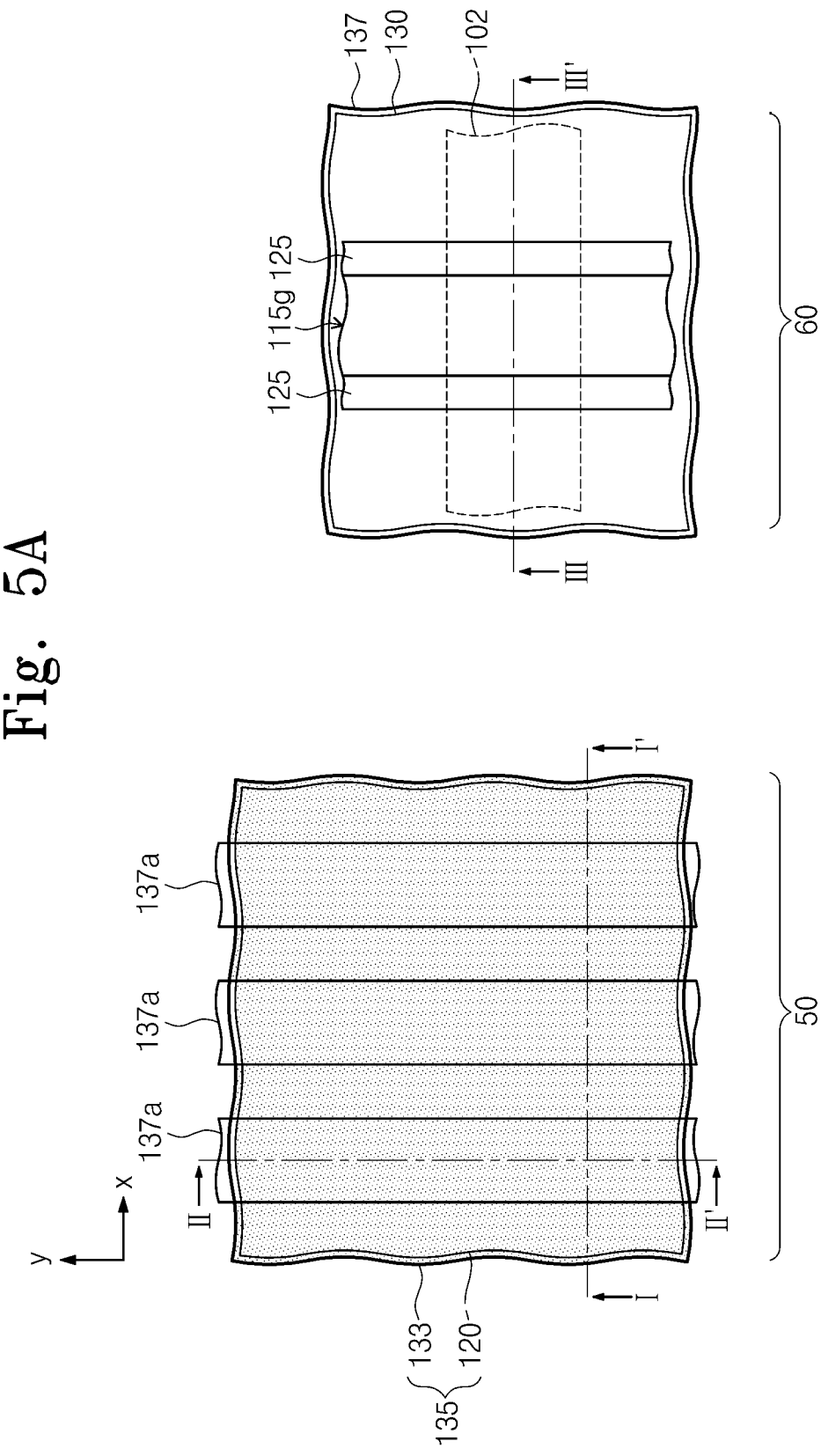

Referring to FIGS. 5A and 5B, a first doped region DR1 may be formed in a lower portion of the semiconductor layer 135, and a second doped region DR2 may be formed in an upper portion of the semiconductor layer 135. The first doped region DR1 may be in contact with the gate conductive layer 115 and the second doped region DR2 may be in contact with the first doped region DR1. The first doped region DR1 may be doped with dopants of the first conductivity type, and the second doped region DR2 may be doped with dopants of a second conductivity type. One of the first and second conductivity types is p-type, and the other is n-type. As a result, the first and second doped regions DR1, DR2 may form a PN junction. In an exemplary embodiment, an interface between the first and second doped regions DR1, DR2 defines a junction interface JC. The junction interface JC may be positioned between a bottom surface of the seed layer 120 and a top surface of the bulk layer 133.

The first doped region DR1 may be formed in at least the seed layer 120. In an exemplary embodiment, the junction interface JC may be formed at a higher level than a top surface of the seed layer 120. That is, the first doped region DR1 may be formed in the seed layer 120 and a lower portion of the bulk layer 133. However, exemplary embodiments of the inventive concepts may not be limited thereto. For instance, the junction interface SC may be formed at substantially the same level as the top surface of the seed layer 120. In still other exemplary embodiments, the junction interface JC may be formed at a level between the bottom and top surfaces of the seed layer 120.

In an exemplary embodiment, the first and second doped regions DR1, DR2 may be formed using an ion implantation method. The formation of the first doped region DR1 may include implanting dopant ions of the first conductivity type into a lower portion of the semiconductor layer 135, and the formation of the second doped region DR2 may include implanting dopant ions of the second conductivity type into an upper portion of the semiconductor layer 135.

In an exemplary embodiment, the first and second doped regions DR1, DR2 may be formed using an in-situ doping method, which may supply a dopant source gas along with a semiconductor source gas during forming of the seed and bulk layers 120, 133. A position of the junction interface JC may be controlled by adjusting the time of supplying the dopant source gas in the in-situ doping step.

Thereafter, a first mask layer 137 may be formed on the substrate 100. The first mask layer 137 in the first region 50 may be patterned to form first mask patterns 137a. The first mask patterns 137a may be formed on the semiconductor layer 135 in the first region 50. As illustrated in FIG. 5A, the first mask patterns 137a may extend parallel to each other along a first direction. Along a second direction perpendicular to the first direction, the first mask patterns 137a may be equally spaced apart from each other. The first and second directions may be parallel to a y-axis and an x-axis shown in FIG. 5A, respectively.

In an exemplary embodiment, the first mask layer 137 in the second region 60 may remain. In another exemplary embodiment, since the interlayer dielectric 130 in the second region 60 may be formed of a material having an etch selectivity to the semiconductor layer 135, the first mask layer 137 in the second region 60 may be removed to expose the underlying interlayer dielectric 130.

The first mask layer 137 may include a photosensitive material, for instance, a photoresist. In this case, the first mask layer 137 may be patterned using a photolithographic process, but exemplary embodiments of the inventive concepts may not be limited thereto. The first mask layer 137 may be formed of a material having an etch selectivity to the semiconductor layer 135.

Referring to FIGS. 6A and 6B, the semiconductor layer 135 and the gate conductive layer 115 in the second region 50 may be successively etched using the first mask patterns 137a as an etch mask. As a result, a lower wiring 115w and a semiconductor line pattern 135a sequentially stacked may be formed under each of the first mask patterns 137a. The lower wiring 115w may include a base pattern 106w, a first barrier pattern 108w, a metal pattern 110w and a second barrier pattern 112w, which are sequentially stacked. As described above, the lower wiring 115w is a resultant structure obtained by patterning the gate conductive layer 115, and thus the base pattern 106w, the first barrier pattern 108w, the metal pattern 110w and the second barrier pattern 112w may be formed of substantially the same material as the base gate 106g, the first barrier gate 108g, the metal gate 110g and the second barrier gate 112g of the gate electrode 115g, respectively.

In an exemplary embodiment, as described above, the formation of the base conductive layer 106 may be omitted. In this case, the lower wiring 115w and the gate electrode 115g may be formed without the base pattern 106w and the base gate 106g, respectively.

The semiconductor line pattern 135a may include a seed line pattern 120a and a bulk line pattern 133a sequentially stacked. A lower portion of the semiconductor line pattern 135a may include the first doped region DR1, and an upper portion of the semiconductor line pattern 135a may include the second doped region DR2.

In an exemplary embodiment, the formation process of the first mask patterns 137a and the etching process of the semiconductor layer 135 and the gate conductive layer 115 using the first mask patterns 137a as an etch mask may be performed as a part of the successive patterning process of the semiconductor layer 135 and the gate conductive layer 115.

First gap regions G1 may be formed between the semiconductor line patterns 135a and between the lower wirings 115w. The first gap regions G1 may extend parallel to each other along the first direction. The first mask patterns 137a may be removed after the formation of the lower wiring 115w and the semiconductor line pattern 135a. Furthermore, the first mask layer 137 remaining in the second region 60 may be removed along with the first mask patterns 137a.

Figure 7A:
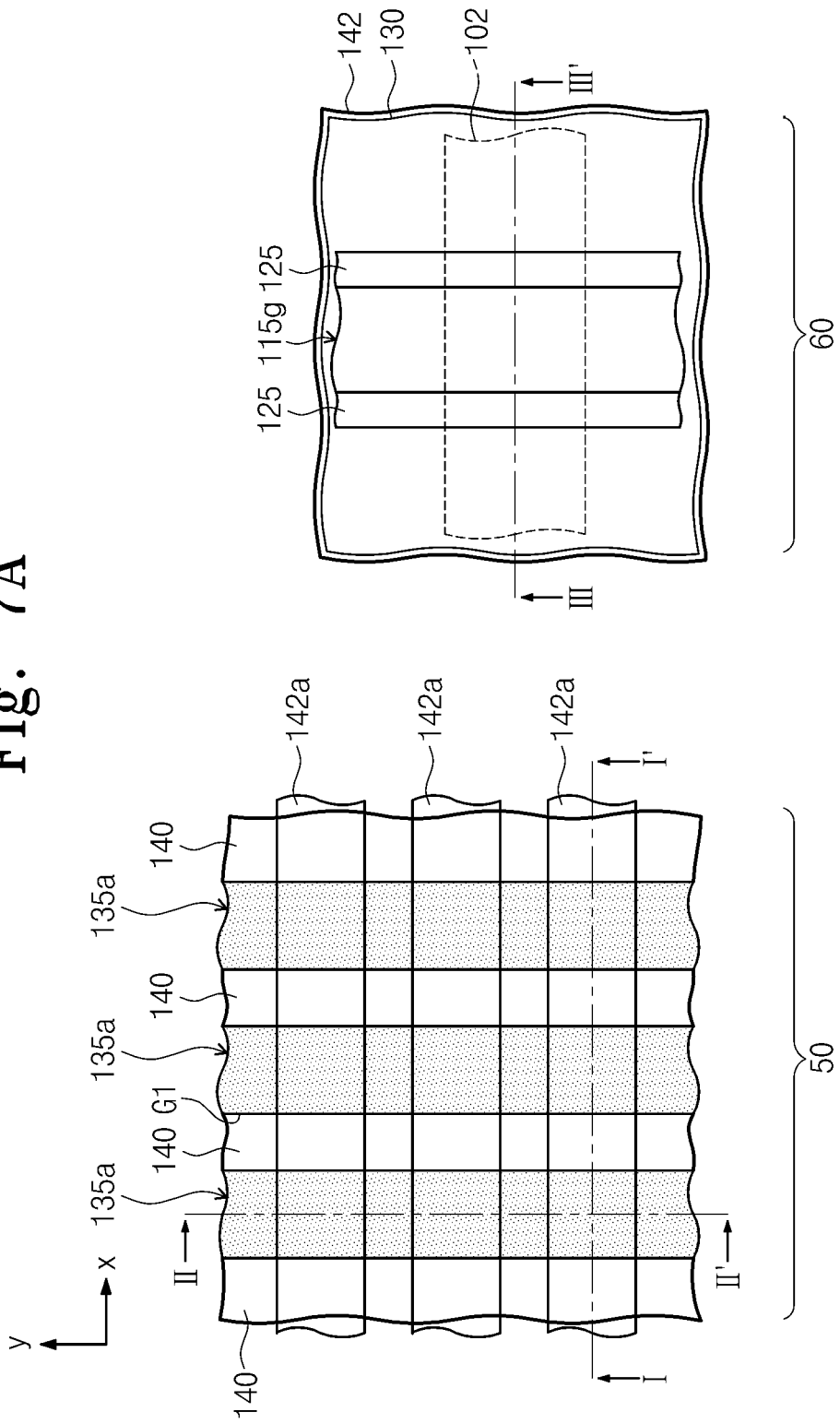

Referring to FIGS. 7A and 7B, a first gap-fill insulating layer may be formed on the substrate 100 to fill the first gap regions G1. Thereafter, the first gap-fill insulating layer may be planarized until the semiconductor line patterns 135a are exposed. Thus, first gap-fill insulating patterns 140 may be formed in the first gap regions G1, respectively. Due to the shape of the first gap region G1, the first gap-fill insulating patterns 140 may extend parallel to each other along a first direction when viewed from a plan view. The first gap-fill insulating layer may include at least one layer of oxide, nitride and/or oxynitride.

Thereafter, a second mask layer may be wholly formed on the substrate 100. The second mask layer in the first region 50 may be patterned to form second mask patterns 142a in the first region 50. The second mask patterns 142a may be formed to cross the semiconductor line patterns 135a. The second mask patterns 142a may be equally spaced apart from each other and extend parallel to each other along the second direction. The second mask layer in the second region 60 may remain, after forming the second mask patterns 142a. The remaining second mask layer 142 may cover the interlayer dielectric 130 in the second region 60, but exemplary embodiments of the inventive concepts may not be limited thereto. For instance, after the formation of the second mask patterns 142a, the second mask layer in the second region 60 may be removed to expose the interlayer dielectric 130 in the second region 60. The second mask layer may be formed of a photoresist layer, and in this case, the second mask layer may be patterned using a photolithographic process. However, exemplary embodiments of the inventive concepts may not be limited thereto. For instance, the second mask layer may include at least one layer that has an etch selectivity to the semiconductor line patterns 135a but is formed of a material different from the photoresist layer.

Figure 8B:
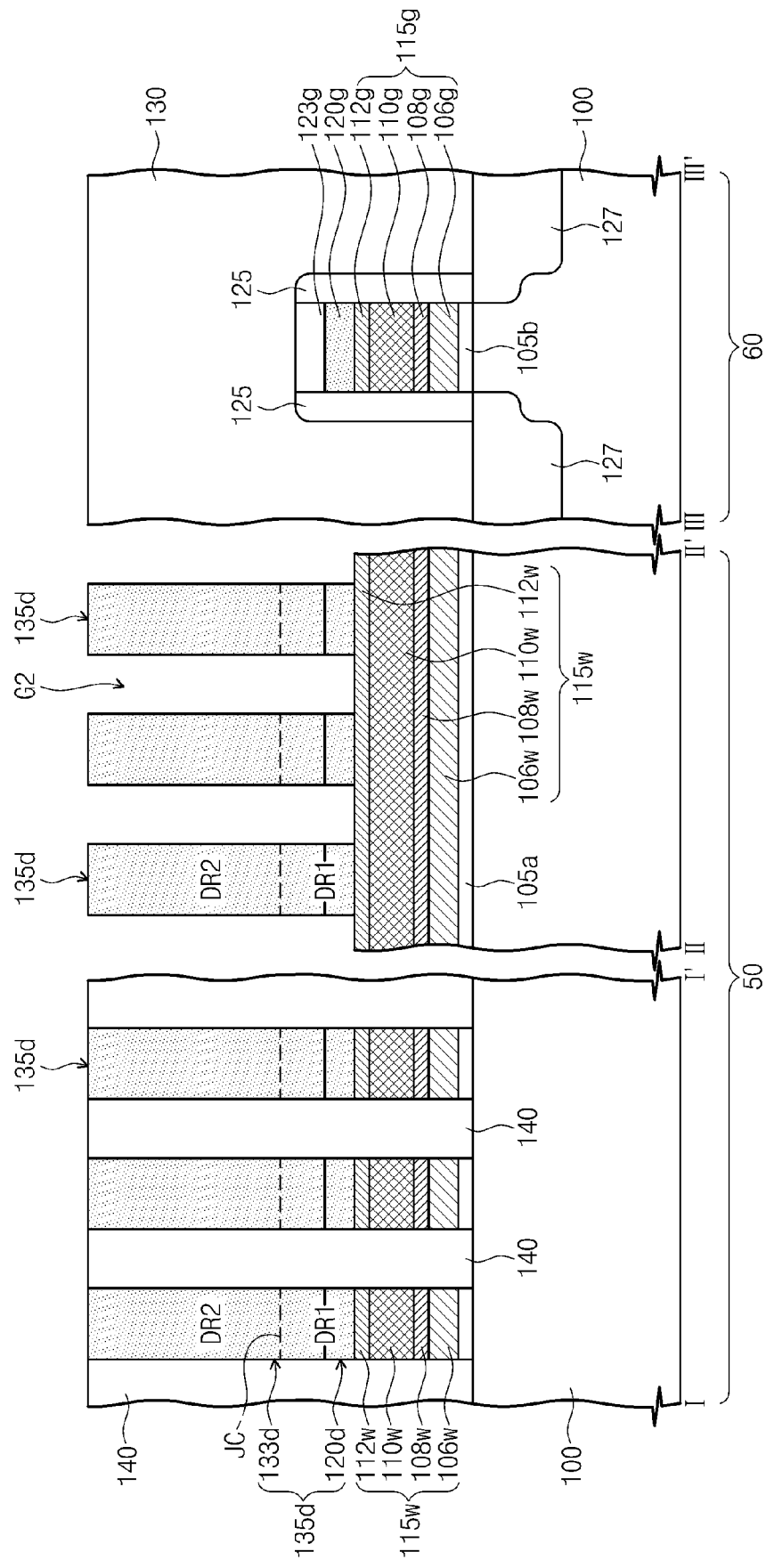

Referring to FIGS. 8A and 8B, diodes 135d may be formed by etching the semiconductor line patterns 135a using the second mask patterns 142a as an etch mask. A plurality of the diodes 135d may be disposed on each of the lower wirings 115w. The diodes 135d disposed on each of the lower wirings 115w may be arranged along the first direction to form a column of the diodes 135d. As described above, the diodes 135a may be defined by the patterning steps using the first-directionally elongated first mask patterns (137a of FIGS. 5A and 5B) and the second-directionally elongated second mask patterns 142a. As a result, each of the diodes 135a may have a rectangular or square top surface when viewed from a plan view. Second gap regions G2 may be formed between the diodes 135d within the column. Each of the second gap regions G2 may have a hole shape with sidewalls confined by the diodes 135d in the first direction and the first gap-fill insulating patterns 140 in the second direction.

The lower wiring 115w may be used as an etch stop layer, during the formation of the diodes 135d or the etching of the semiconductor line patterns 135a. In an exemplary embodiment, the second barrier pattern 112w of the lower wiring 115w may serve as the etch stop layer. In another exemplary embodiment, the metal pattern 110w of the lower wiring 115w may serve as the etch stop layer, and in this case, the semiconductor line pattern 135a and the second barrier pattern 112w may be successively etched during the formation of the diodes 135d.

The diode 135d may include a seed portion 120d and a bulk portion 133d sequentially stacked. The seed portion 120d and the bulk portion 133d may correspond to a portion of the seed line pattern 120a and a portion of the bulk line pattern 133a, respectively. The diode 135 may include the first doped region DR1 and the second doped region DR2 forming the PN junction. The first doped region DR1 of the diode 135d may be electrically coupled to the lower wiring 115w, and the second doped region DR2 of the diode 135d may be disposed on the first doped region DR1 of the diode 135d. The first doped region DR1 of the diode 135d may be formed in the seed portion 120d, and the second doped region DR2 of the diode 135d may be formed in the bulk portion 133d on the first doped region DR1 or in a region spanning from the seed portion 120d to the bulk portion 133d.

The second mask patterns 142a may be removed after the formation of the diodes 135d. In the case that the second mask layer 142 remains in the second region 60, the second mask layer 142 in the second region 60 may be removed along with the second mask patterns 142a.

Figure 9B:
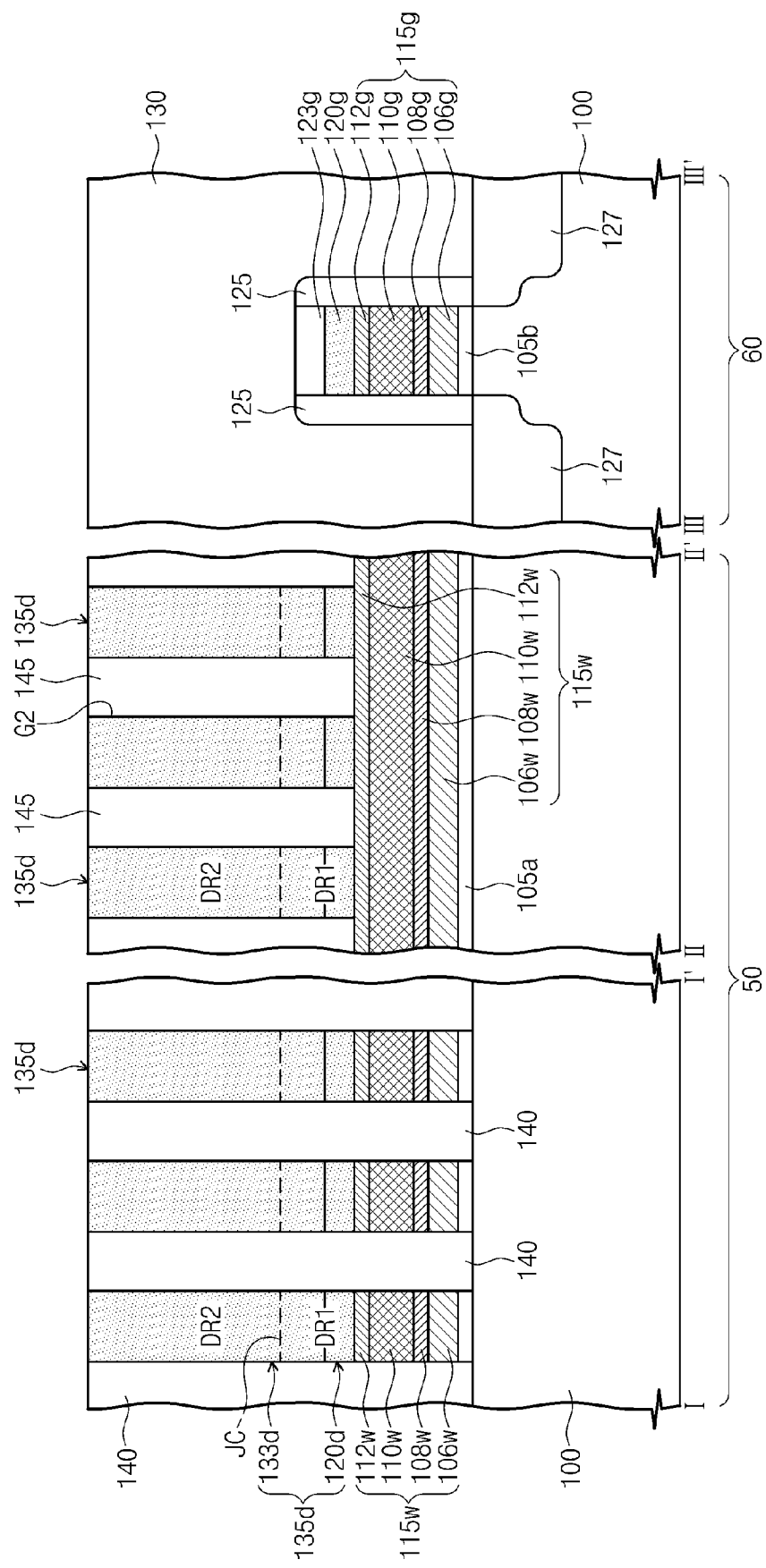

Referring to FIGS. 9A and 9B, a second gap-fill insulating layer may be formed on the substrate 100 to fill the second gap regions G2. The second gap-fill insulating layer may include at least one layer of oxide, nitride and/or oxynitride. The second gap-fill insulating layer may be planarized to form second gap-fill insulating patterns 145 exposing the diodes 135d and filling the respective second gap regions G2.

Figure 10A:
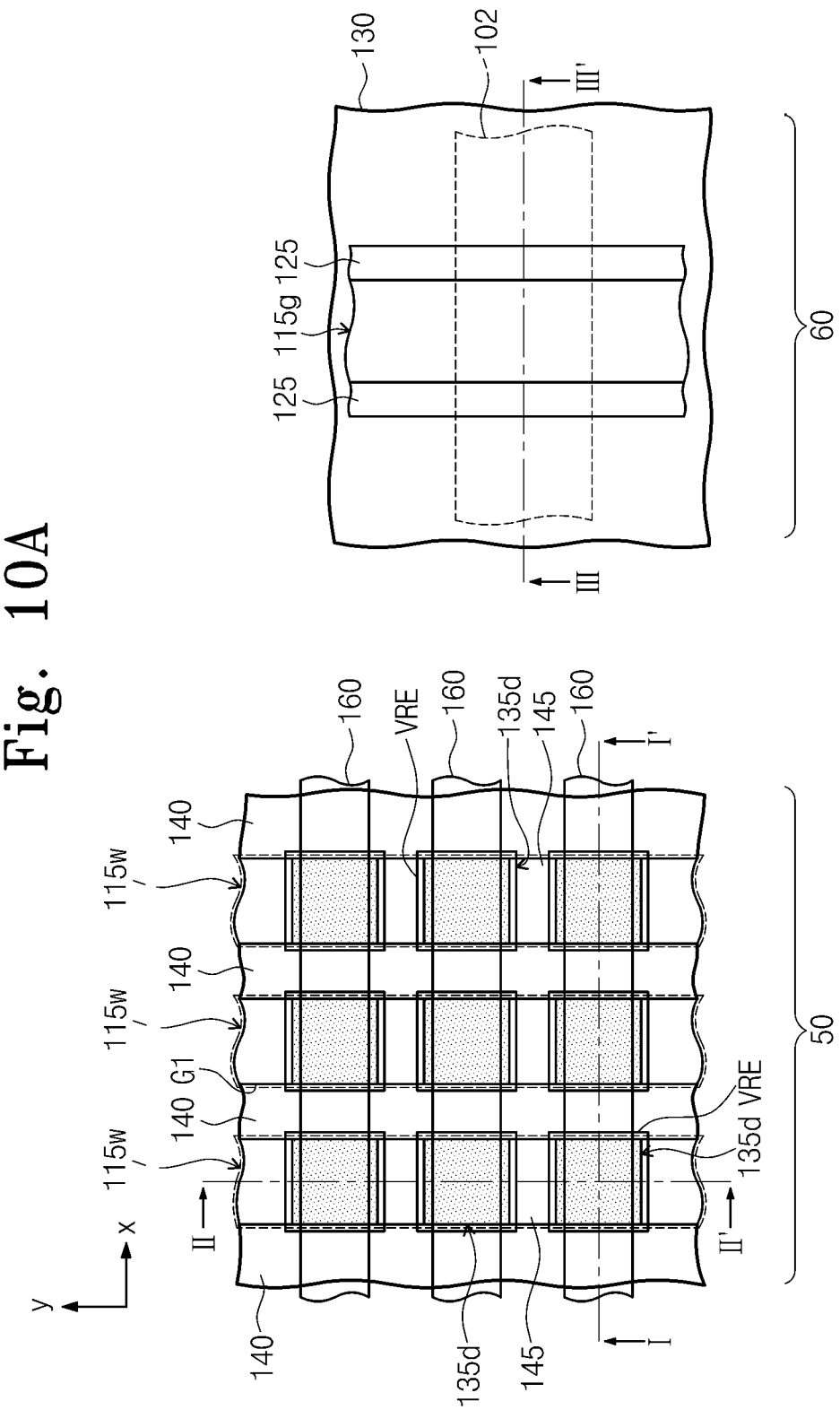
FIG. 10A is a plan view illustrating a semiconductor memory device according to exemplary embodiments of the inventive concepts.

As seen in FIGS. 10A and 10B a variable resistance element VRE may be formed to be electrically connected to the diode 135d, and an upper wiring 160 may be formed to be electrically connected to the variable resistance element VRE. Methods of forming the variable resistance element VRE and the upper wiring 160 will be described in further detail below.

According to the above described exemplary embodiments, the lower wirings 115w in the first region 50 may include the same conductive material as the gate electrode 115g in the second region 60. The gate electrode 115g may include a conductive material having a low resistivity, and thus, the lower wirings 115w may also include the conductive material having a low resistivity. As a result, it is possible to realize a semiconductor memory device with a fast operating speed. Furthermore, the lower wiring 115w may include the metal pattern 110w, which may be formed of the same metal as the metal gate 110g of the gate electrode 115g. Accordingly, the lower wiring 115w may have a further low resistance.

Moreover, the semiconductor layer 135 serving as the diode 135d may include the seed layer 120 and the bulk layer 133. The bulk layer 133 may be formed using the seed layer 120 partially exposed in the first region 50 as a seed layer. As a result, the bulk layer 133 may be easily formed. For instance, the seed layer 120 exposed in the first region 50 may have a large area, so that the deposition rate of the bulk layer 133 can be increased. As a result, the productivity of the semiconductor memory device can increase.

Hereinafter, methods of forming the variable resistance element VRE and the upper wiring 160 will be described in further detail with reference to FIGS. 10A and 10B.

FIG. 10A is a plan view illustrating a semiconductor memory device according to an exemplary embodiment of the inventive concepts, and FIG. 10B is a sectional view taken along lines I-I', II-II' and III-III' of FIG. 10A.

Referring to FIGS. 9A, 9B, 10A and 10B, top surfaces of the diodes 135d may be recessed to a lower level than top surfaces of the first and second gap-fill insulating patterns 140, 145. Accordingly, recess regions surrounded by the first and second gap-fill insulating patterns 140, 145 may be formed on the respective diodes 135d. Thereafter, a spacer layer may be conformally formed on the resultant structure provided with the recess regions, and then the spacer layer may be etched using an etch-back process to expose the diodes 135d. Accordingly, sidewall spacers 147 may be formed on sidewalls of the recess region, and a hole surrounded by the sidewall spacer 147 may be formed in each of the recess regions. The hole may be formed to expose the diode 135d. The sidewall spacer 147 may be formed of an insulating material having an etch selectivity to the first and second gap-fill insulating patterns 140, 145. For instance, in the case that the first and second gap-fill insulating patterns 140, 145 are formed of oxide, the sidewall spacer 147 may be formed of nitride and/or oxynitride.

Thereafter, a conductive layer may be formed on the substrate 100 to fill the holes, and the conductive layer may be planarized to form lower contact plugs 150 exposing the first and second gap-fill insulating patterns 140, 145. The lower contact plugs 150 may include at least one layer of doped semiconductor (e.g., doped silicon, doped germanium and/or any other suitable doped semiconductor), metal (e.g., tungsten and/or any other suitable metal), conductive metal nitride (e.g., titanium nitride, tantalum nitride and/or any other suitable conductive metal nitride) or transition metal (e.g., titanium, tantalum and/or any other suitable transition metal). The contact plug 150 may be formed to have a pillar shape. However, exemplary embodiments of the inventive concepts may not be limited thereto. That is, the contact plug 150 may be formed to have a shape different from the pillar shape, such as triangular, pentagonal, hexagonal, cross or tubular shapes.

The variable resistance elements VRE may be formed on the lower contact plugs 150, respectively. The variable resistance element VRE may include a variable resistance material whose resistance or crystalline structure can be reversibly changed by a signal applied thereto (e.g., an electric signal such as a voltage and an electric current, an optical signal, or a radiation). As a result, the variable resistance element VRE may serve as a data storing element capable of storing logical data. The variable resistance element VRE may be electrically connected to the diode 135d via the lower contact plug 150. Each of the diodes 135d and the variable resistance element VRE connected thereto may constitute a memory cell. The variable resistance element VRE may be realized in various structures or shapes, as will be described in further detail below.

According to an exemplary embodiment, the variable resistance elements VRE or the memory cells may be two-dimensionally arranged in rows and columns when viewed from a plan view. The columns may be parallel to the first direction, and the rows may be parallel to the second direction. Each of the variable resistance elements VRE may be spaced apart from other variable resistance elements in the same row and the same column. That is, each of the variable resistance elements VRE may be spaced apart from all of the remaining variable resistance elements VRE, but exemplary embodiments of the inventive concepts may not be limited thereto.

An upper interlayer dielectric 153 may be formed on the resultant structure provided with the variable resistance elements VRE. The upper interlayer dielectric 153 may cover the variable resistance elements VRE. Upper wirings 160 may be formed on the interlayer dielectric 153. The upper wirings 160 may extend parallel to each other along the second direction. Each of the upper wirings 160 may be electrically connected to some of the variable resistance elements VRE constituting each of the rows. In an exemplary embodiment, the upper wiring 160 may be electrically connected to the variable resistance element VRE via an upper contact plug 155 penetrating the upper interlayer dielectric 153, but exemplary embodiments of the inventive concepts may not be limited thereto. The upper wiring 160 may include at least one layer of a conductive material. In an exemplary embodiment, the upper wiring 160 may include a conductive layer having a low resistivity. For instance, the upper wiring 160 may include a metal layer of tungsten, copper, and/or aluminum. In addition, the upper wiring 160 may further include at least one layer of conductive metal nitride (e.g., titanium nitride, tantalum nitride, tungsten nitride and/or any other suitable conductive metal nitride) and/or transition metal (e.g., titanium, tantalum and/or any other suitable transition metal).

Hereinafter, structural features of semiconductor memory devices according to exemplary embodiments of the inventive concepts will be described with reference to FIGS. 10A and 10B. Semiconductor memory devices depicted in FIGS. 10A and 10B may include features previously described with reference to FIGS. 1A through 9A and FIGS. 1B through 9B.

Referring to FIGS. 10A and 10B, a plurality of the lower wirings 115w may be disposed the substrate 100 in the first region 50. The lower wirings 115w may extend parallel to each other along the first direction. The lower wirings 115w may be equally spaced apart from each other along the second direction perpendicular to the first direction. The wiring-insulating layer 105a may be interposed between the substrate 100 and the respective lower wirings 115w, in the first region 50. The lower wiring 115w may include the base pattern 106w, the first barrier pattern 108w, the metal pattern 110w and the second barrier pattern 112w sequentially stacked.

A plurality of the diodes 135d may be disposed on each of the lower wirings 115w. The diodes 135d disposed on each of the lower wirings 115w may be arranged along the first direction to form a column of the diodes 135d. The diodes 135d may be spaced apart from each other in each column. Each of the diodes 135*a* may have a rectangular or square top surface from a plan view. The variable resistance element VRE may be electrically connected to a top surface of each diode 135*d*.

As described above, the substrate 100 may include the active region 102 provided in the second region 60. The gate electrode 115*g* may be formed to cross the active region 102, and the gate insulating layer 105*b* may be interposed between the gate electrode 115*g* and the active region 102. The gate electrode 115*g* may include the base gate 106*g*, the first barrier gate 108*g*, the metal gate 110*g* and the second barrier gate 112*g*, sequentially stacked. The capping semiconductor pattern 120*g* and the capping insulating pattern 123*g* may be sequentially stacked on the gate electrode 115*a*. The capping semiconductor pattern 120*g* and the capping insulating pattern 123*g* may include sidewalls aligned with both sidewalls of the gate electrode 115*a*. The gate spacer 125 may be disposed on both sidewalls of the gate electrode 115*g*, the capping semiconductor pattern 120*g* and the capping insulating pattern 123*g*. Source/drain regions 127 may be disposed in the active region 102 at both sides of the gate electrode 115*g*.

The base pattern 106*w*, the first barrier pattern 108*w*, the metal pattern 110*w* and the second barrier pattern 110*w* of the lower wiring 115*w* may be formed of substantially the same conductive materials as the base gate 106*g*, the first barrier gate 108*g*, the metal gate 110*g* and the second barrier gate 112*g* of the gate electrode 115*g*, respectively. The base gate 106*g*, the first barrier gate 108*g*, the metal gate 110*g* and the second barrier gate 112*g* may be formed of substantially the same materials as those of embodiments described with reference to FIGS. 1A, 1B, 2A and 2B. In an exemplary embodiment, the base gate 106*g* and the base pattern 106*w* may be omitted. The wiring-insulating layer 105*a* may be formed of substantially the same material as the gate insulating layer 105*b*. Moreover, the wiring-insulating layer 105*a* may be formed to have substantially the same thickness as the gate insulating layer 105*b*.

In an exemplary embodiment, a level Lv1 of a bottom surface of the lower wiring 115*w* from the top surface of the substrate 100 may be substantially equivalent to a level Lv2 of a bottom surface of the gate electrode 115*g*. Thus, a level Lva of a top surface of the metal pattern 110*w* of the lower wiring 115*w* disposed under the diode 135*d* may be substantially equivalent to a level Lvb of a top surface of the metal gate 110*g* of the gate electrode 115*g*.

Each of the diodes 135*d* may include the seed portion 120*d* and the bulk portion 133*d* sequentially stacked. The seed portion 120*d* and the bulk portion 133*d* may include a semiconductor layer. The seed portion 120*d* and the bulk portion 133*d* may be in a single crystalline state. The diode 135*d* may include the first doped region DR1 and the second doped region DR2 forming a PN junction. The first doped region DR1 may be formed at least in the seed portion 120*d* and electrically coupled to the lower wiring 115*w*. The second doped region DR2 may be disposed on the first doped region DR2. The first doped region DR1 may be a region doped with dopants of the first conductivity type, and the second doped region DR2 may be a region doped with dopants of the second conductivity type. One of the first and second conductivity types is p-type, and the other is n-type. An interface between the first and second doped regions DR1, DR2 or a junction interface JC may be positioned between bottom and top surfaces of the diode 135*d*. In an exemplary embodiment, the junction interface JC of the PN junction may be positioned between bottom and top surfaces of the bulk portion 133*d*, but exemplary embodiments of the inventive concepts may not be limited thereto. For instance, the junction interface JC of the PN junction may be positioned between bottom and top surfaces of the seed portion 120*d*.

The capping semiconductor pattern 120*g* on the gate electrode 115*g* may include a semiconductor layer, which may be formed of the same semiconductor material as the semiconductor layer included in the seed portion 120*d*. The capping semiconductor pattern 120*g* may be doped with the same dopants as the seed portion 120*d* or be in an undoped state.

The first gap-fill insulating pattern 140 may be disposed between the lower wirings 115*w* adjacent to each other. The first gap-fill insulating pattern 140 may extend parallel to the lower wiring 115*w*. The first gap-fill insulating pattern 140 may have a thickness sufficient to extend above a top surface of the lower wiring 115*w*. In an exemplary embodiment, the first gap-fill insulating pattern 140 may have a thickness sufficient to extend above the top surface of the diode 135*d*. The second gap-fill insulating pattern 145 may be interposed between the diodes 135*d* adjacent to each other on each lower wiring 115*w*. A top surface of the second gap-fill insulating pattern 145 may be positioned at substantially the same level as a top surface of the first gap-fill insulating pattern 140. The interlayer dielectric 130 may be disposed on the substrate 100 in the second region 60. A top surface of the interlayer dielectric 130 may be positioned at substantially the same level as the top surface of the first gap-fill insulating pattern 140 and/or the top surface of the second gap-fill insulating pattern 145.

As described above, the variable resistance elements VRE may be electrically coupled to the diodes 135*d*, respectively. The upper wiring 160 may be electrically coupled to a top surface of the variable resistance element VRE. The upper wirings 160 may cross the lower wirings 115*w* and be parallel to each other. Each of the upper wirings 160 may be electrically coupled to a row of the variable resistance elements VRE arranged along the first direction. One of the lower wiring 115*w* and the upper wiring 160 may serve as a word line, and the other may serve as a bit line. For instance, the lower wiring 115*w* may serve as the word line, and the upper wiring 160 may serve as the bit line.

According to the aforementioned semiconductor memory device, the lower wiring 115*w* may include a conductive layer, which may be formed of substantially the same material as the gate electrode 115*g* in the second region 60. That is, the lower wiring 115*w* may be formed of the same conductive material as the gate electrode 115*g* including a low resistivity material. Since the lower wiring 115*w* also has a low resistivity, it is possible to realize a semiconductor memory device with a fast operating speed. Moreover, a memory cell including the variable resistance element VRE and the diodes 135*d* may be disposed at intersectional regions between the lower wirings 115*w* and the upper wirings 160. As a result, the semiconductor memory device having an increased integration density may be fabricated.

The variable resistance element VRE may be realized in various structures or shapes, as will be described in further detail with reference to FIGS. 11 through 13.

Figure 11:
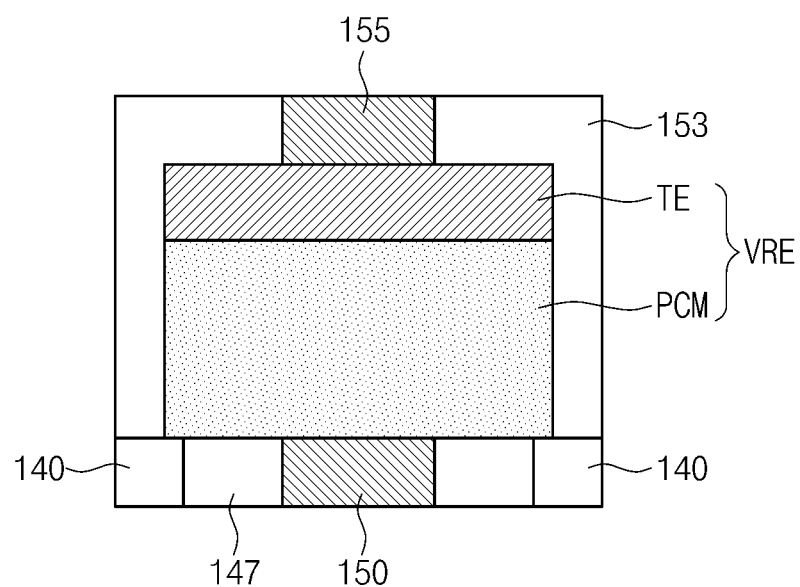
FIG. 11 is an enlarged view of a portion 'A' of FIG. 10B illustrating a data storing element according to exemplary embodiments of the inventive concepts.

FIG. 11 is an enlarged view of a portion 'A' of FIG. 10B illustrating a data storing element according to exemplary embodiments of the inventive concepts.

Referring to FIG. 11, the variable resistance element VRE according to exemplary embodiments may include a phase changeable material pattern PCM and a top electrode TE that are stacked sequentially. The phase changeable material pattern PCM may exhibit one of two crystal states, for example, an amorphous state or a crystalline state, which can be reversibly changed by a heating temperature and/or a heating/cooling duration. The phase changeable material pattern PCM in the crystalline state may exhibit a smaller resistivity than that of the phase changeable material pattern PCM in the amorphous state. That is, for the phase changeable material pattern PCM, a change in crystal state may cause a change in resistivity. This mechanism of resistivity change may be used to store data into the phase changeable material pattern PCM. The phase changeable material pattern PCM may include at least one chalcogenide element such as tellurium (Te) and/or selenium (Se). In addition, the phase changeable material pattern PCM may further include at least one of germanium (Ge), antimony (Sb), bismuth (Bi), palladium (Pd), tin (Sn), argentum (Ag), Arsenic (As), sulfur (S), silicon (Si), phosphorus (Ph), oxygen (O) and/or nitrogen (N). In an exemplary embodiment, the phase changeable material pattern PCM may include at least one material of Ge—Sb—Te, As—Sb—Te, As—Ge—Sb—Te, Sn—Sb—Te, Ag—In—Sb—Te, In—Sb—Te, a group 5A element-Sb—Te, a group 6A element—Sb—Te, a group 5A element—Sb—Se, a group 6A element—Sb—Se, Ge—Sb, In—Sb, Ga—Sb, and/or a doped Ge—Sb—Te material, where the doped Ge—Sb—Te material may be doped with at least one of C, N, B, Bi, Si, P, Al, Dy or Ti.

The top electrode TE may include a conductive metal nitride layer. For instance, the top electrode TE in contact with upper contact plug 155 may include at least one material of titanium nitride, tantalum nitride or tungsten nitride. Upper dielectric layer 153 is in contact with upper contact plug 155, with top electrode TE, with phase change material PCM and with gap filling insulating pattern 140. A bottom surface of the phase changeable material pattern PCM may be in contact with the lower contact plug 150, which may be used as a heater electrode. Sidewall spacers 147 are adjacent to lower contract plug 150 and to gap filling insulating patterns 140. In an exemplary embodiment, a portion of the phase changeable material pattern PCM, which is in contact with the lower contact plug 150, may correspond to a programmable region capable of being changed from the crystalline state to the amorphous state, or vice versa.

Figure 12:
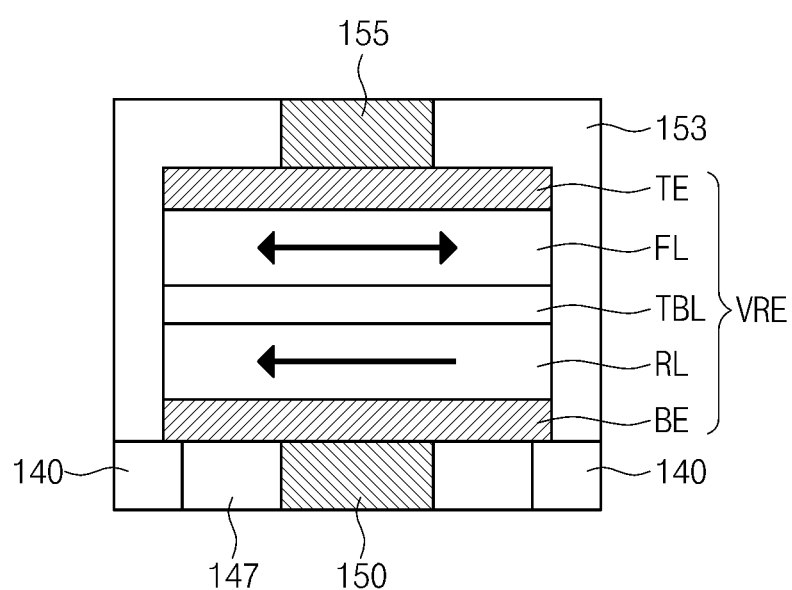
FIG. 12 is an enlarged view of a portion 'A' of FIG. 10B illustrating a data storing element according to other exemplary embodiments of the inventive concepts.

FIG. 12 is an enlarged view of a portion 'A' of FIG. 10B illustrating a data storing element according to an exemplary embodiment of the inventive concepts.

Referring to FIG. 12, the variable resistance element VRE may include a magnetic tunnel junction (MTJ) pattern. In an exemplary embodiment, the variable resistance element VRE may include a reference layer RL, a free layer FL and a tunnel barrier layer TBL. The tunnel barrier layer TBL may be interposed between the reference layer RL and the free layer FL. The reference layer RL may have a magnetization direction fixed in a specific direction, and the free layer FL may have a reversible magnetization direction. For instance, the magnetization direction of the free layer FL may be parallel or antiparallel to the magnetization direction of the reference layer RL. The reference layer RL, the tunnel barrier layer TBL and the free layer FL may be included in the magnetic tunnel junction pattern.

When the magnetization directions of the free and reference layers FL, RL are parallel to each other, the magnetic tunnel junction pattern may exhibit a lower electrical resistance than when they are antiparallel to each other. This mechanism of resistivity change caused by the magnetization orientation may be used to store data into the variable resistance element VRE. The free layer FL and the reference layer RL may include at least one magnetic layer. The tunnel barrier layer TBL may include a dielectric layer such as magnesium oxide or aluminum oxide.

In an exemplary embodiment, data stored in the variable resistance element VRE may be switched by reorienting the magnetization direction of the free layer FL using the spin torque of electrons in a program current. In other exemplary embodiments, data stored in the variable resistance element VRE may be switched by reorienting the magnetization direction of the free layer FL using a current-induced magnetic field.

As shown in FIG. 12, the magnetization directions of the free layer FL and the reference layer RL may be parallel to a top surface of the substrate 100 or the tunnel barrier layer TBL. Alternatively, the magnetization directions of the free layer FL and the reference layer RL may be perpendicular to the top surface of the substrate 100 or the tunnel hairier layer TBL.

The variable resistance element VRE may include a bottom electrode BE disposed under the magnetic tunnel junction pattern and a top electrode TE disposed on the magnetic tunnel junction pattern. The bottom and top electrodes BE, TE may include at least one layer of conductive metal nitride (e.g., titanium nitride, tantalum nitride and/or any other suitable conductive metal nitride), transition metal (e.g., titanium, tantalum and/or any other suitable transition metal) or rare-earth metal (e.g., ruthenium and/or any other suitable rare-earth metal).

Figure 13:
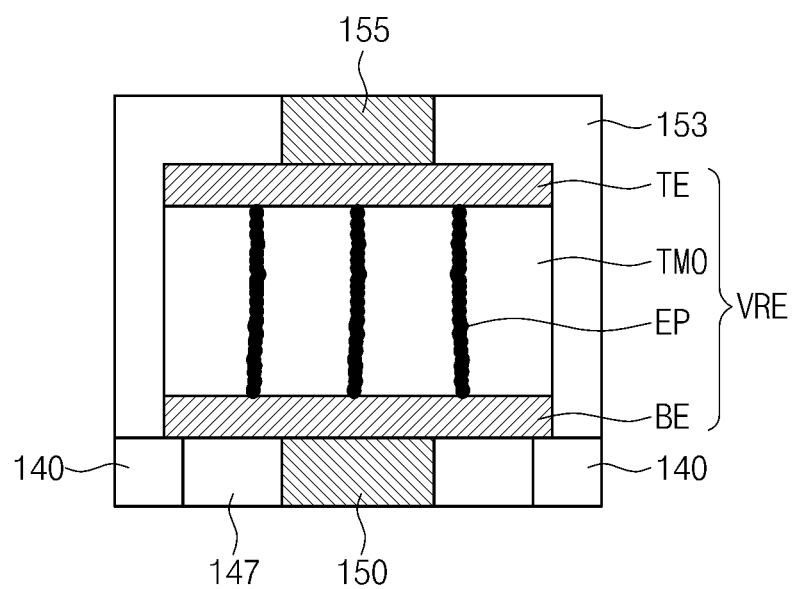
FIG. 13 is an enlarged view of a portion 'A' of FIG. 10B illustrating a data storing element according to still other exemplary embodiments of the inventive concepts.

FIG. 13 is an enlarged view of a portion 'A' of FIG. 10B illustrating a data storing element according to an exemplary embodiment of the inventive concepts.

Referring to FIG. 13, the variable resistance element VRE may include a dielectric pattern TMO having varying resistance depending on whether an electrical path EP exists or not. For instance, an electrical path EP can be created or lost in the dielectric pattern TMO by a program operation. Generally, the dielectric pattern TMO including the electrical path EP exhibits low resistance as compared with the absence of the electrical path EP. In an exemplary embodiment, the dielectric pattern TMO may include a transition metal oxide layer. For instance, the dielectric pattern TMO may include at least one layer of niobium oxide, titanium oxide, nickel oxide, zirconium oxide, vanadium oxide, PCMO((Pr,Ca)MnO3), strontium-titanium oxide, barium-strontium-titanium oxide, strontium-zirconium oxide, barium-zirconium oxide, or barium-strontium-zirconium oxide.

The electrical path EP may be created when vacancies are connected to each other. Alternatively, the electrical path EP may occur when metal atoms in the dielectric pattern TMO are connected to each other. The variable resistance element VRE may further include a bottom electrode BE and a top electrode TE that are disposed under and on the dielectric pattern TMO, respectively. In an exemplary embodiment, the bottom and top electrodes BE, TE may include at least one layer of conductive metal nitride (e.g., titanium nitride, tantalum nitride and/or any other suitable conductive metal nitride), transition metal (e.g., titanium, tantalum and/or any other suitable transition metal) or rare-earth metal (e.g., ruthenium, platinum and/or any other suitable rare-earth metal).

Figure 14B:
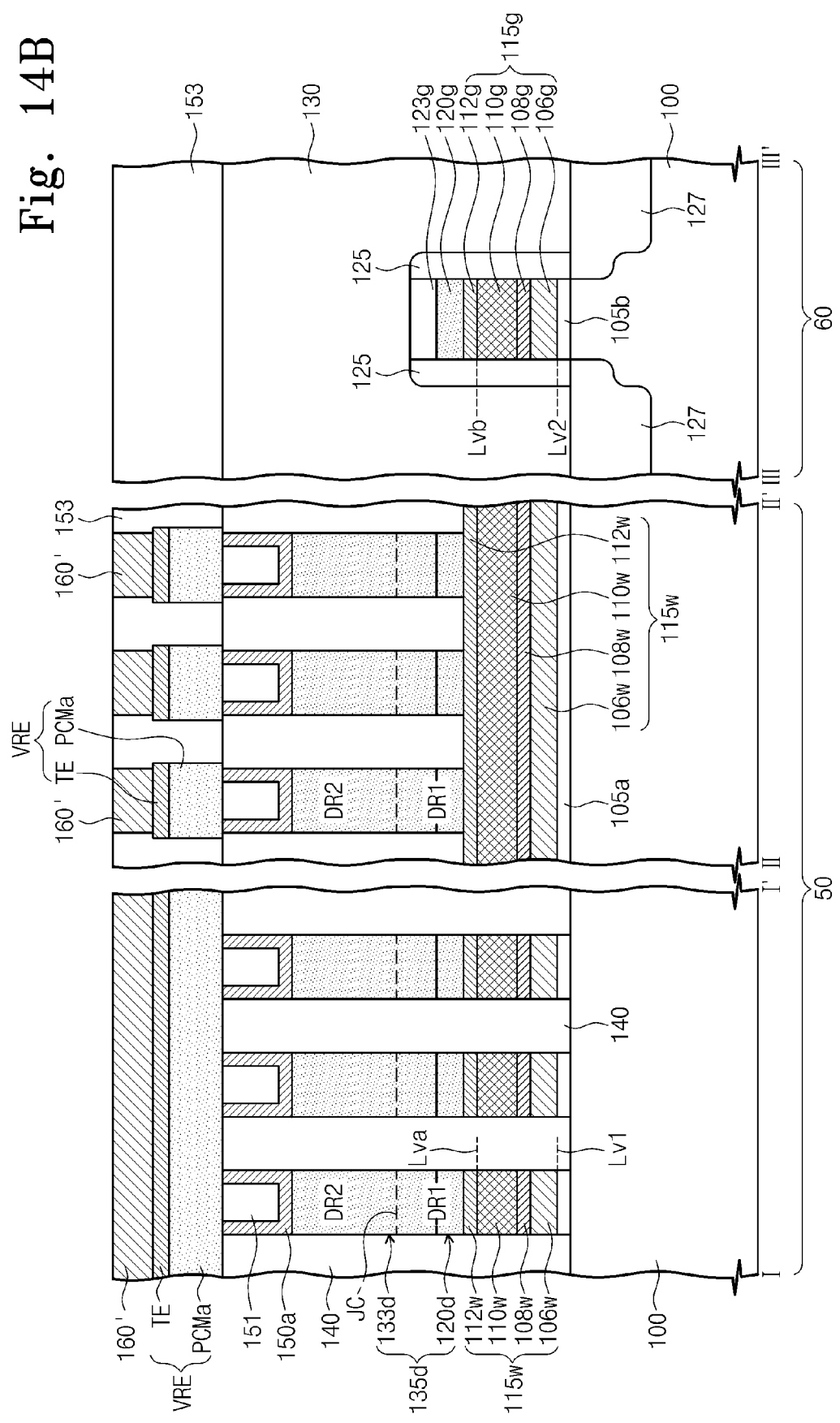
FIG. 14B is a sectional view taken along lines and III-HP of FIG. 14A.
Figure 15A:
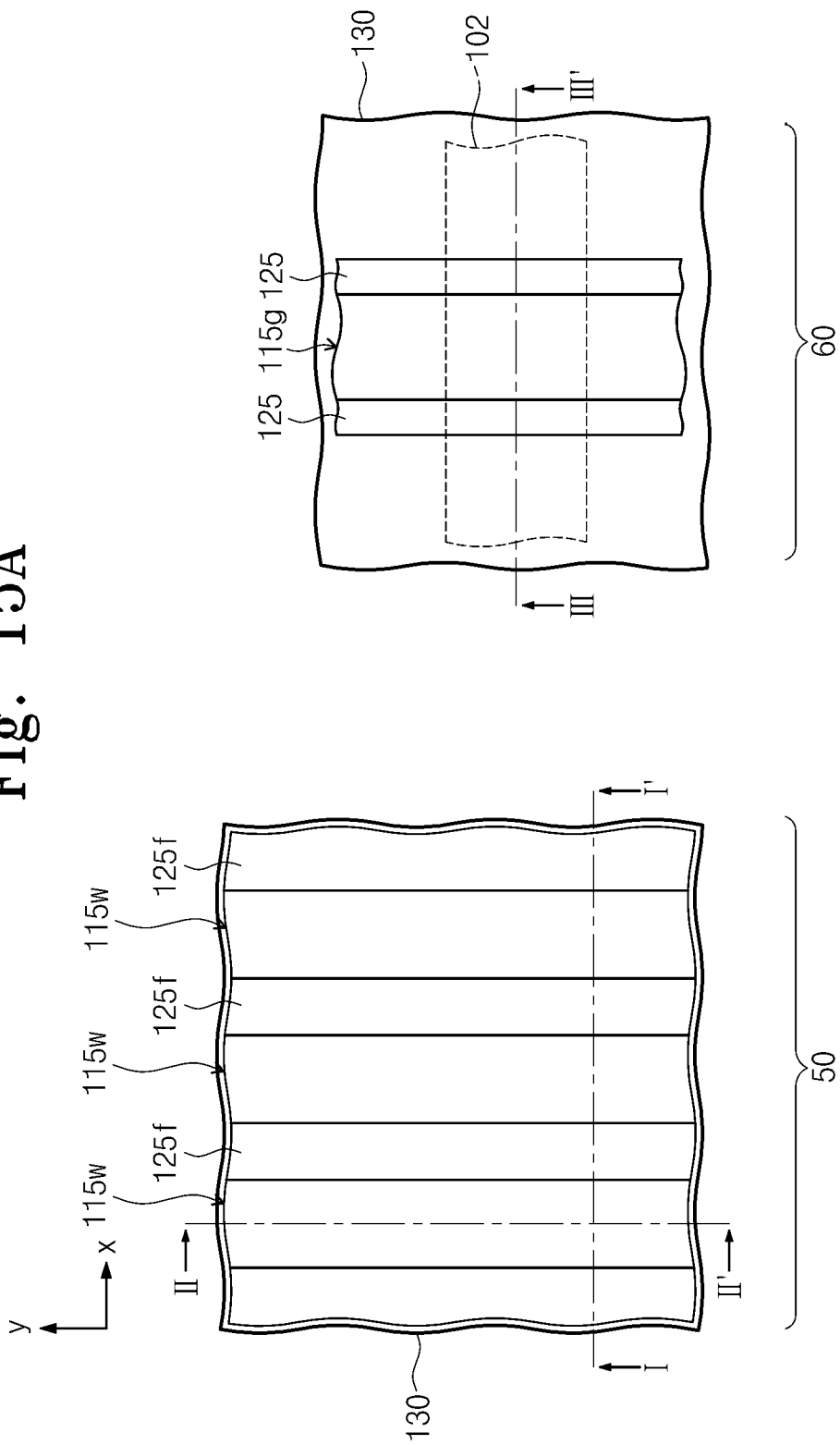
Figure 15B:
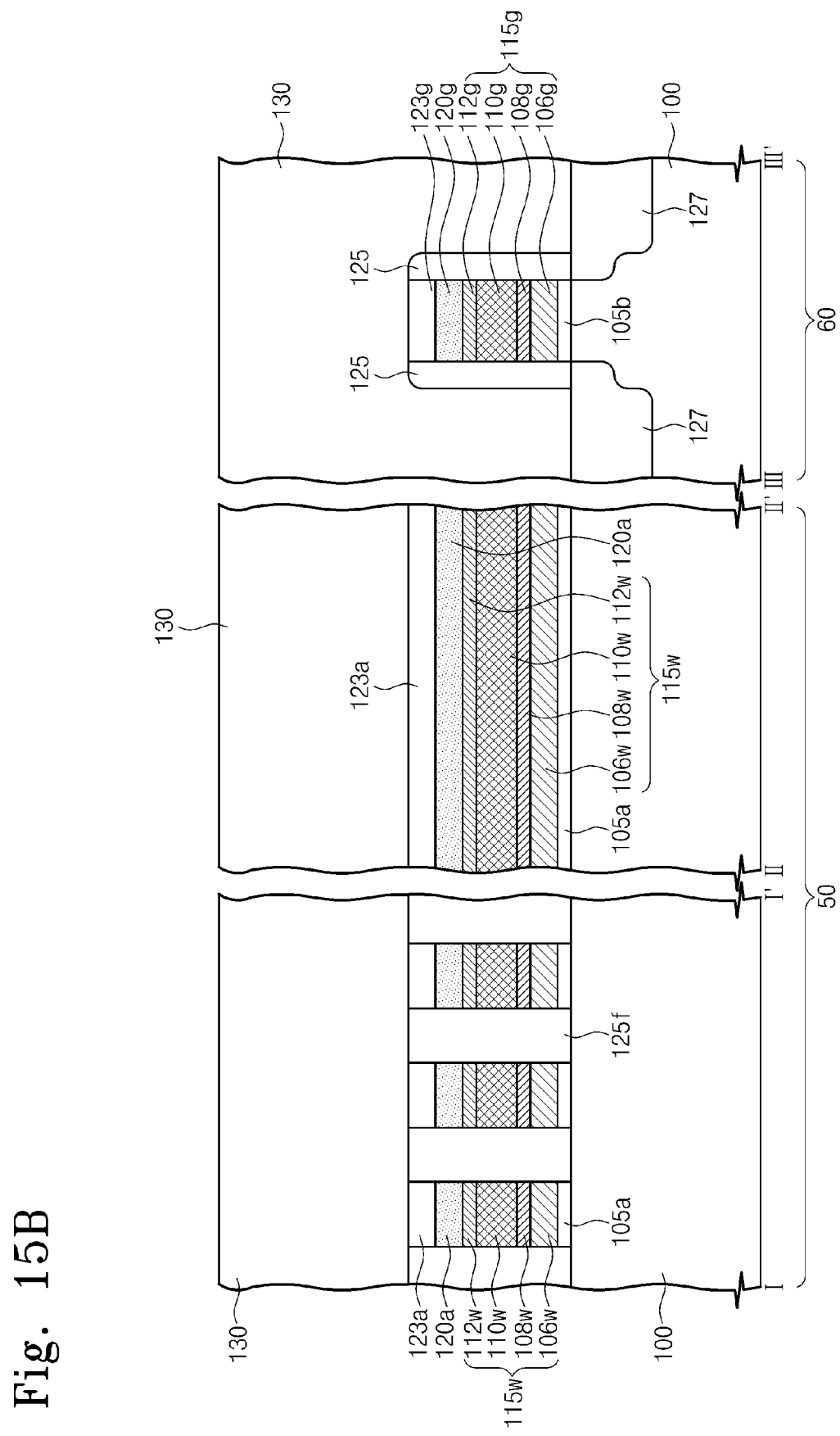
FIGS. 15B, 16B, 17B and 18B are sectional views taken along lines I-I', II-II' and III-III' of FIGS. 15A, 16A, 17A and 18A, respectively.

FIG. 14A is a plan view illustrating a variable resistance element according an exemplary embodiment of the inventive concepts, and FIG. 14B is a sectional view taken along lines I-I', II-II' and III-III' of FIG. 14A.

Referring to FIGS. 14A and 14B, a variable resistance element VRE may include a phase changeable material pattern PCMa extending parallel to upper wirings 160'. The phase changeable material patterns PCMa may extend parallel to each other along the second direction. Each of the phase changeable material patterns PCMa may be electrically coupled to a plurality of diodes 135d arranged along a row. Lower contact plugs 150a may be disposed on the diodes 135d, respectively. The lower contact plug 150a may be formed to have a cylindrical shape. A dielectric pattern 151 may be formed to fill an inner space of the lower contact plug 150a. Each of the phase changeable material patterns PCMa may be in contact with a plurality of the lower contact plugs 150a thereunder. The phase changeable material pattern PCMa may be formed of substantially the same material as that described with reference to FIG. 11.

The top electrode TE of the variable resistance element VRE may extend parallel with the phase changeable material pattern PCMa. The top electrode TE may be formed to cover a whole top surface of the phase changeable material pattern PCMa.

The variable resistance elements VRE may be covered with an interlayer dielectric 153. The upper wiring 160' may be formed to fill a groove provided in the interlayer dielectric 153. A substantially whole bottom surface of the upper wiring 160' may be in contact with the top electrode TE.

The exemplary embodiments described with reference to FIGS. 10A, 10B, 11 through 13, 14A and 14B may modified, provided that such modifications maintain consistent relationships between its elements in accordance with the previously described exemplary embodiments. For example, for the exemplary embodiments described with reference to FIGS. 10A and 10B, the lower contact plug 150 shown in FIG. 10B may be formed to have a structure of the lower contact plug 150a shown in FIG. 14B.

FIGS. 15A through 18A are plan views illustrating methods of fabricating a semiconductor memory device according to exemplary embodiments of the inventive concepts, and FIGS. 15B through 18B are sectional views taken along lines I-I', II-II' and III-III' of FIGS. 15A through 18A, respectively. The methods according to the present embodiments may include processes performed in substantially the same manner as described with reference to the previously described exemplary embodiments.

Referring to FIGS. 1A, 1B, 15A and 15B, the capping insulating layer 123, the seed layer 120 and the gate conductive layer 115 may be successively patterned to form a lower wiring 115w, a seed line pattern 120a and a line-capping insulating pattern 123a that are sequentially stacked in the first region 50. The capping insulating layer 123, the seed layer 120 and the gate conductive layer 115 may be successively patterned to form a gate electrode 115g, a capping semiconductor pattern 120g and a gate-capping insulating pattern 123g that are sequentially stacked in second region 60. The lower wiring 115w and the gate electrode 115g may be formed simultaneously. Similarly, the seed line pattern 120a and the capping semiconductor pattern 120g may be formed using the same process.

A gate spacer layer may be conformally formed on the substrate 100 provided with the lower wiring 115w and the gate electrode 115g, and etched in an etch-back manner to form gate spacers 125 on both sidewall of the gate electrode 115g. During the formation of the gate spacers 125, spacer patterns 125f may be formed in the first region 50. Each of the spacer patterns 125f may fill an empty region provided between the lower wirings 115w adjacent to each other. The spacer patterns 125f may extend parallel with the lower wirings 115w. In an exemplary embodiment, the spacer pattern 125f may be a portion of the gate spacer layer, and thus, the spacer pattern 125f may be formed of the same material as the gate spacer 125.

Source/drain regions 127 may be formed in the active region 102 at both sides of the gate electrode 115g. The source/drain region 127 may be formed to have a lightly doped drain (LDD) structure using the gate spacer 125.

Thereafter, an interlayer dielectric 130 may be wholly formed on the substrate 100. The spacer pattern 125f and the gate spacer 125 may be formed of an insulating material having an etch selectivity to the interlayer dielectric 130. Moreover, the line- and gate-capping insulating patterns 123a, 123g may be formed of an insulating material having an etch selectivity to the interlayer dielectric 130. For instance, the interlayer dielectric 130 may be formed of oxide, and the spacer pattern 125f, the gate spacer 125, the line-capping insulating pattern 123a and the gate-capping insulating pattern 123g may be formed of nitride and/or oxynitride.

Figure 16B:
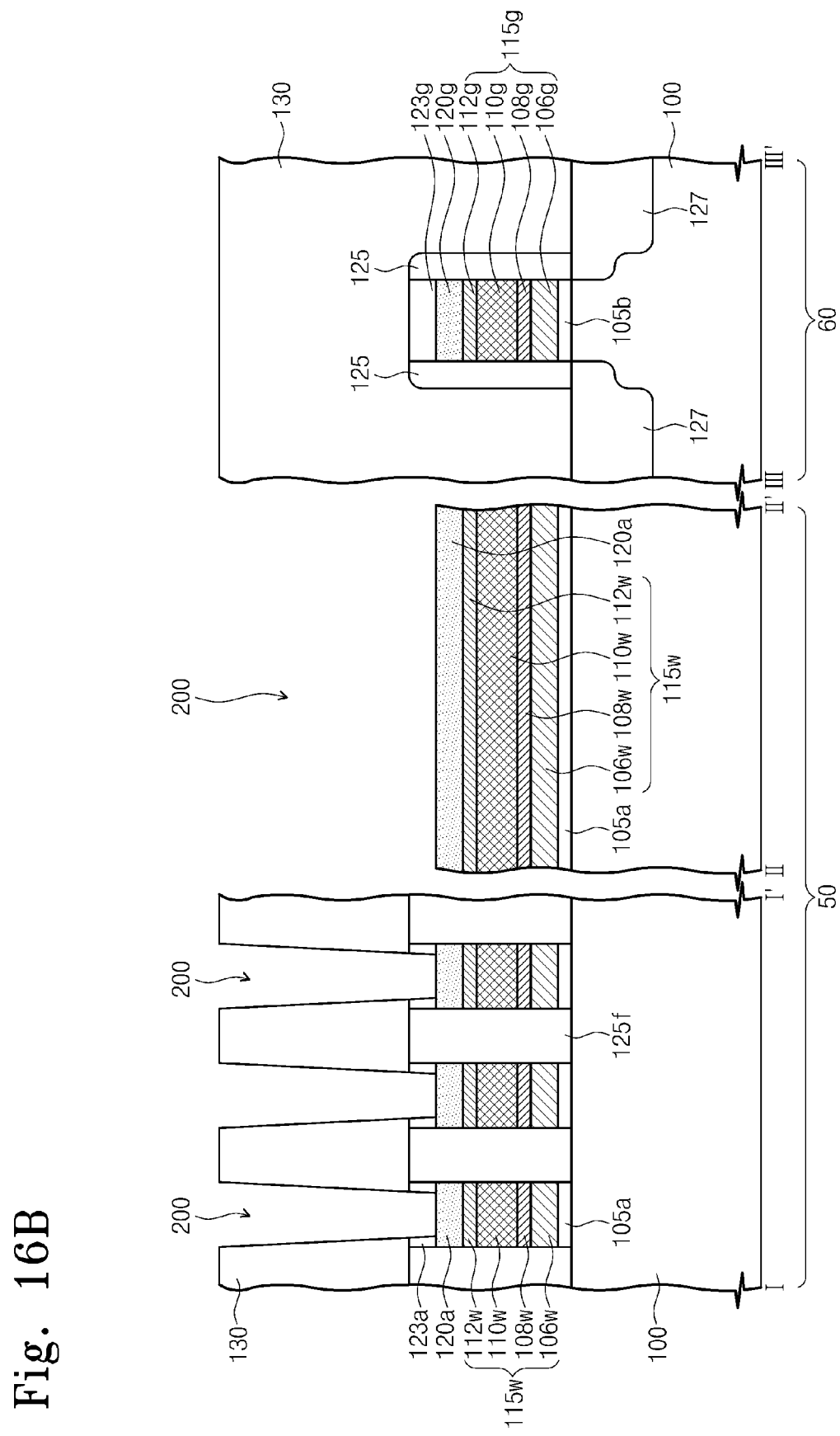

Referring to FIGS. 16A and 16B, the interlayer dielectric 130 may be patterned to form a plurality of openings 200 in the first region 50. In an exemplary embodiment, the line-insulating patterns 123a may be used as an etch stop layer during the formation of the openings 200. Furthermore, the line-insulating patterns 123a exposed by the openings 200 may be etched to expose the seed line patterns 120a. As a result, the openings 200 may be formed to expose the seed line patterns 120a, respectively. As shown in FIG. 16A, the openings 200 may be formed to have a tapering groove shape extending parallel to the seed line patterns 120a. In an exemplary embodiment, a second directional bottom width of the opening 200 may differ from a second directional width of a top surface of the seed line pattern 120a, where the first and second directions may be parallel to y-axis and x-axis as shown in FIG. 16A. In an exemplary embodiment, the bottom width of the opening 200 may be smaller than the width of the top surface of the seed line pattern 120a, but exemplary embodiments of the inventive concepts may not be limited thereto.

Figure 17A:
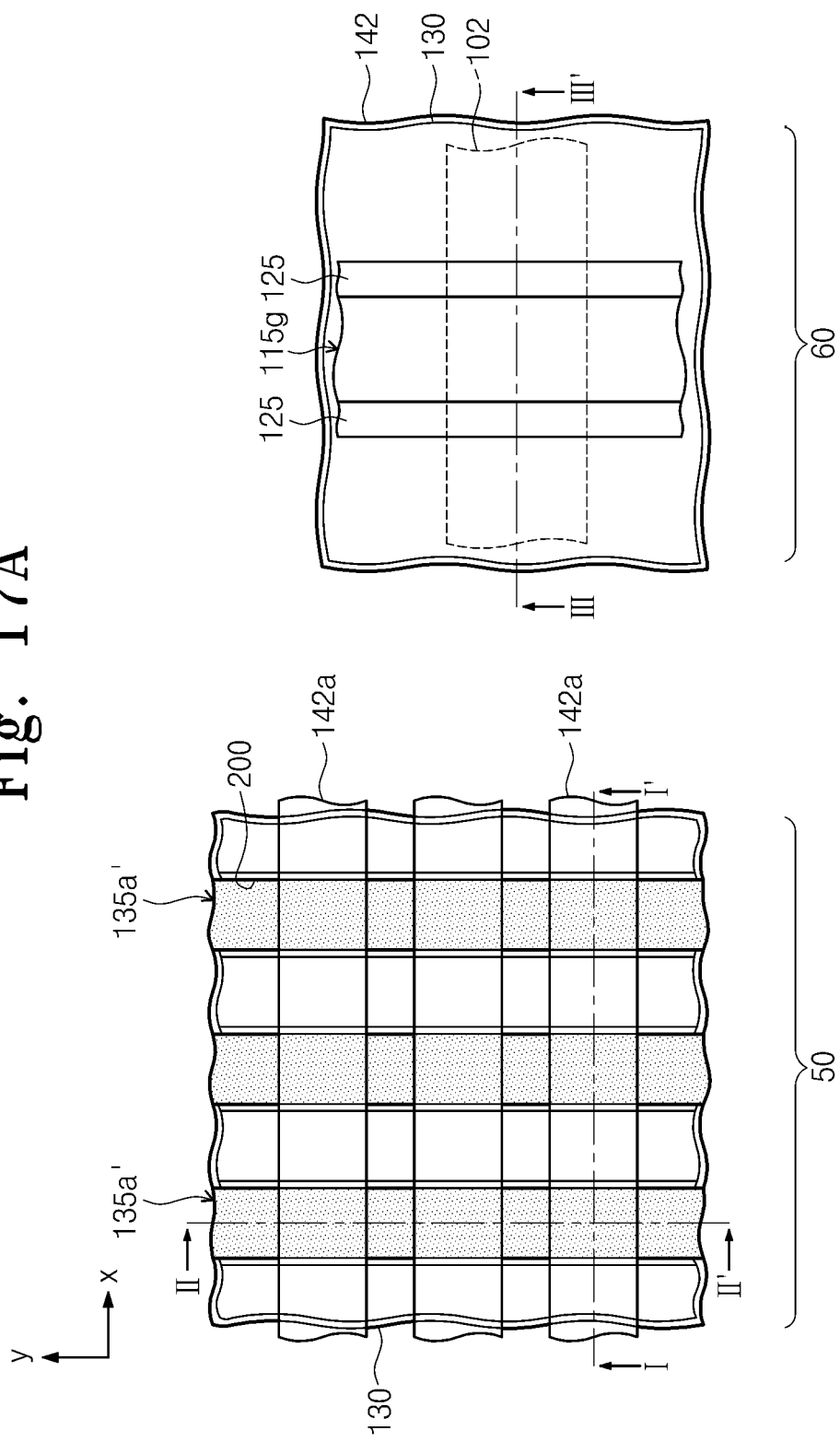
Figure 17B:
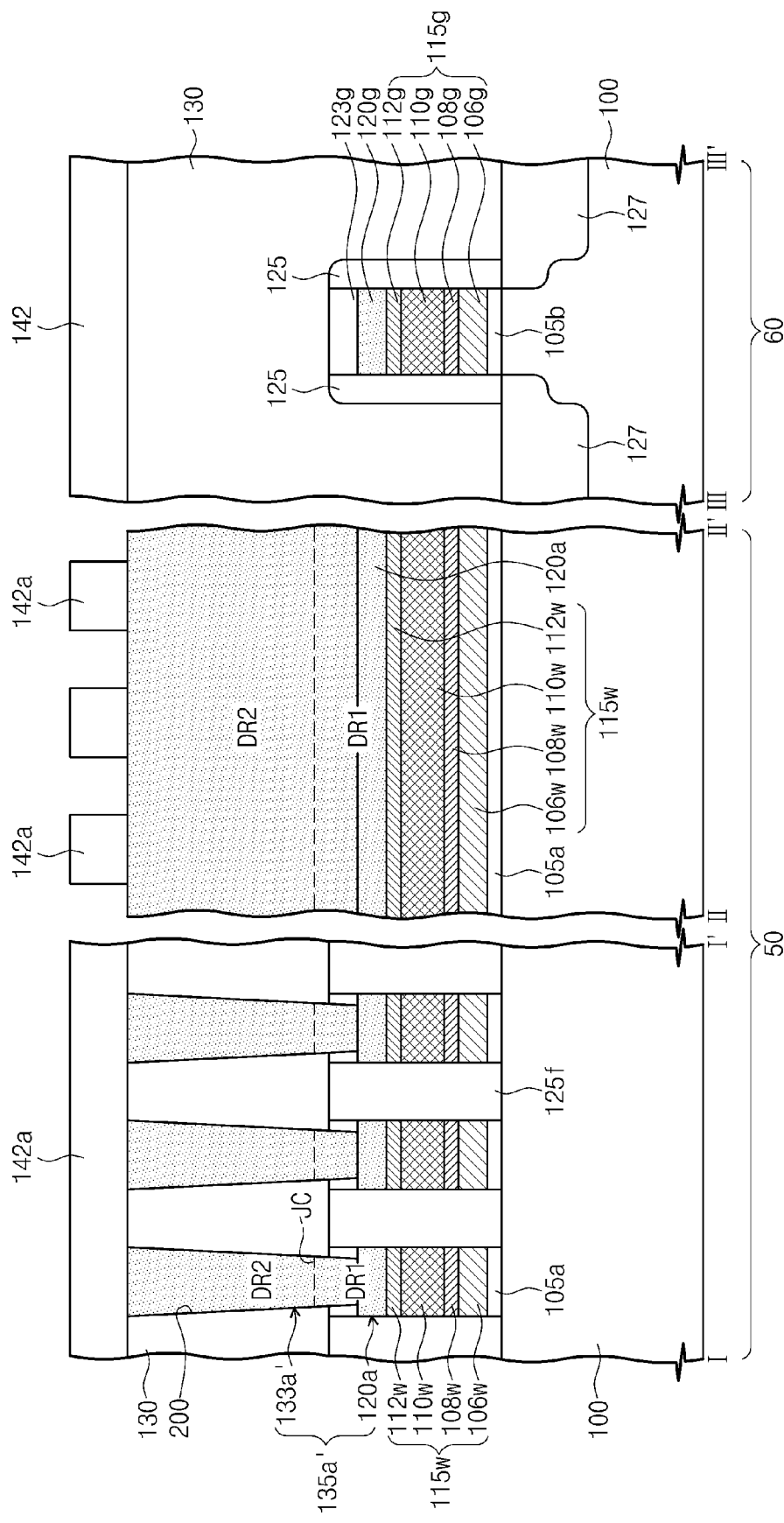

Referring to FIGS. 17A and 17B, bulk line patterns 133a' may be formed to fill the openings 200, respectively. The bulk line pattern 133a' may be formed of substantially the same material as the bulk layer 133 described with reference to FIGS. 4A and 4B. The bulk line pattern 133a' may be formed by a selective epitaxial growth (SEG) process using the seed line pattern 120a as a seed layer. As the result of the SEG process, the bulk line pattern 133a' may have substantially the same crystalline structure, for instance, a single crystalline state, as the seed line pattern 120a.

The bulk line pattern 133a' may be formed using other methods. For instance, the formation of the bulk line pattern 133a' may include forming an amorphous semiconductor layer on the substrate 100 to fill the openings 200, planarizing the amorphous semiconductor layer to expose the interlayer dielectric 130, and then irradiating a laser beam onto the planarized amorphous semiconductor layer. Then, during a subsequent cooling step, the planarized amorphous semiconductor layer may exhibit substantially the same crystalline structure, for instance, a single crystalline state, as the seed line pattern 120a.

The seed line pattern 120a and the bulk line pattern 133a' may constitute a semiconductor line pattern 135a'. A first doped region DR1 doped with dopants of the first conductivity type may be formed in a lower portion of the semiconductor line pattern 135a', and a second doped region DR2 doped with dopants of a second conductivity type may be formed in an upper portion of the semiconductor line pattern 135a'. The first and second doped regions DR1, DR2 may be in contact with each other and form a PN junction. The first doped region DR1 may be formed at least in the seed line pattern 120a and connected to the lower wiring 115w. In an exemplary embodiment, in the case that the bottom width of the opening 200 is smaller than a width of the seed line pattern 120a, an interface between the first and second doped regions DR1, DR2 or a junction interface JC may be positioned between bottom and top surfaces of the bulk line pattern 133a'. In an exemplary embodiment, the first and second doped regions DR1, DR2 may be formed using an ion implantation method. In other embodiments, the first and second doped regions DR1, DR2 may be formed using an in-situ method.

Next, a mask layer may be formed on the substrate 100 and patterned to form mask patterns 142a in the first region 50. Here, the interlayer dielectric 130 of the second region 60 may be covered by a remaining mask layer 142. The mask patterns 142a may extend parallel to each other along the second direction. The mask patterns 142a may cross over the semiconductor line patterns 135a'.

Figure 18A:
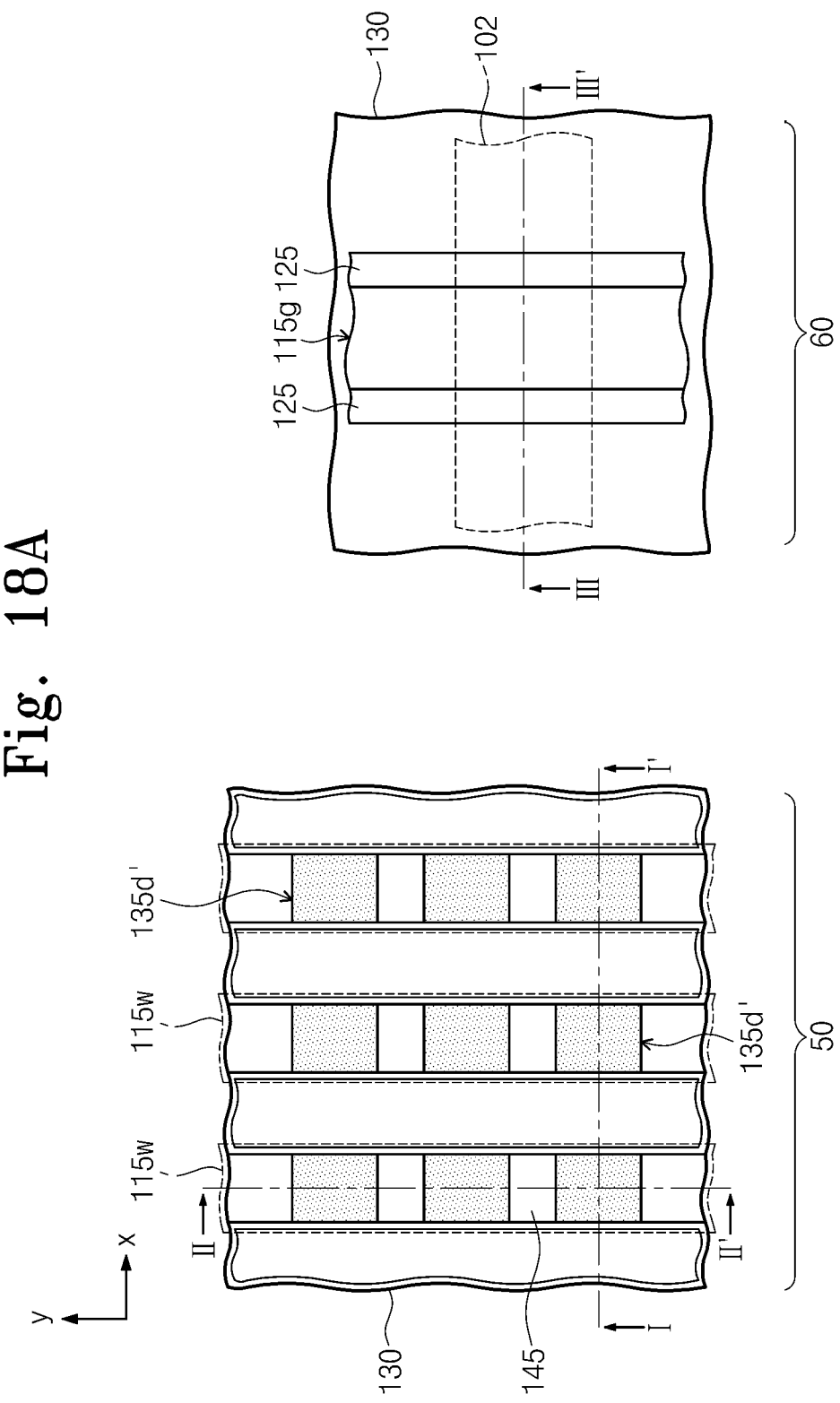
Figure 18B:
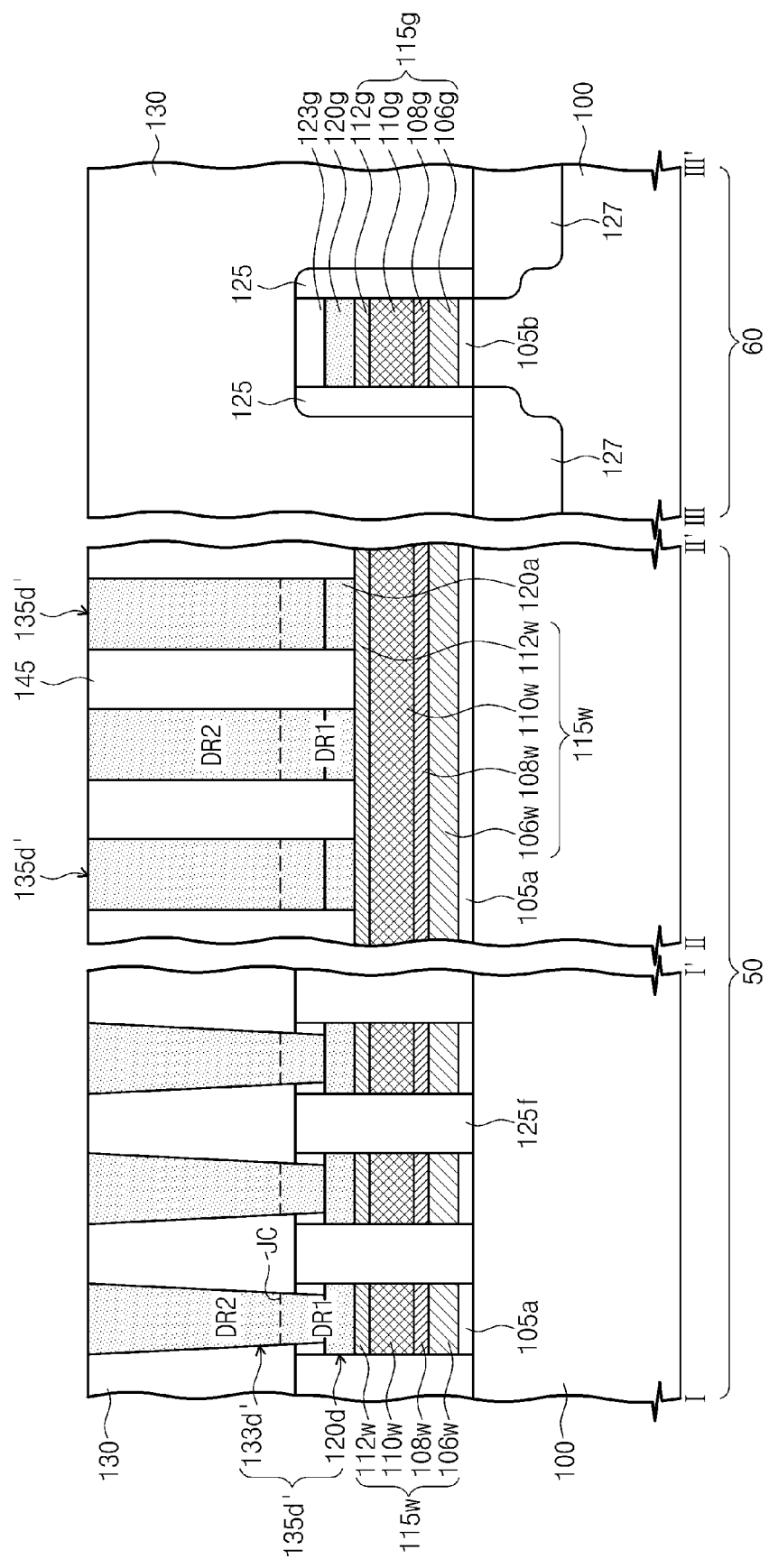

Referring to FIGS. 18A and 18B, the semiconductor line patterns 135a' may be etched using the mask patterns 142a as an etch mask to form diodes 135d'. Each of the diodes 135d' may have a rectangular or square top surface from a plan view. Each of the diodes 135d' may include a seed portion 120d and a bulk portion 133d' sequentially stacked on the lower wirings 115w. The diode 135d' may include the first doped region DR1 and the second doped region DR2 that are in contact with each other. The first doped region DR1 may be formed at least in the seed portion 120d to be electrically coupled to the lower wiring 115w, and the second doped region DR2 may be in contact with a top surface of the first doped region DR1. The junction interface JC of the first and second doped regions DR1, DR2 may be positioned between bottom and top surfaces of the bulk portion 133d'. Thereafter, the mask patterns 142a may be removed, and a portion of the mask layer 142 remaining in the second region 60 may be removed along with the mask patterns 142a.

Next, gap-fill insulating patterns 145 may be formed to fill gap regions, which may be formed by etching the semiconductor line pattern 135a'. A top surface of the gap-fill insulating patterns 145 may have a rectangular or square top surface from a plan view.

Figure 19A:
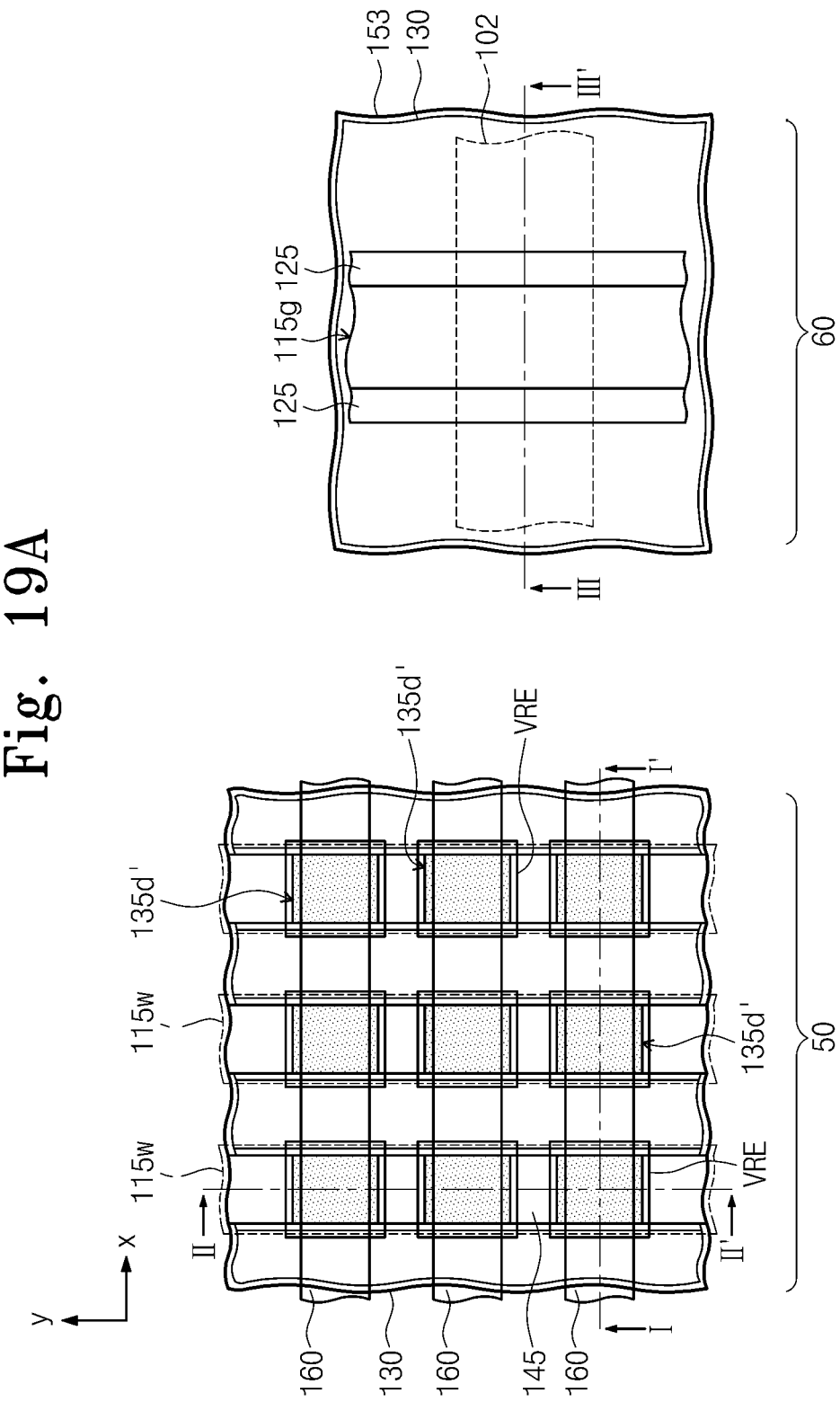
FIG. 19A is a plan view illustrating a semiconductor memory device according to an exemplary embodiment of the inventive concepts.

Thereafter, as shown in FIGS. 19A and 19B, a variable resistance element VRE and an upper wiring 160 may be formed on the resultant structure provided with the gap-fill insulating patterns 145. Therefore, the semiconductor memory device shown in FIGS. 19A and 19B can be realized.

According to the aforementioned semiconductor memory device, the lower wiring 115w may be also formed of substantially the same material as the gate electrode 115g. Thus, it is possible to realize a semiconductor memory device with a fast operating speed. In addition, since the diodes 135d' are formed on the lower wiring 115w, an occupying area of a memory cell can be reduced and consequently the semiconductor memory device can have an increased integration density.

According to the aforementioned fabrication methods, the lower wiring 115w and the gate electrode 115g may be simultaneously formed using the same process. Furthermore, the bulk line pattern 133a' may be deposited on the opening 200 having an increased width relative to the hole, the bulk line pattern 133a' can be deposited with an increased deposition rate, and consequently, the semiconductor memory device can be fabricated with increased productivity.

Hereinafter, semiconductor memory devices according to the embodiments will be described with reference to FIGS. 19A and 19B.

FIG. 19A is a plan view illustrating a semiconductor memory device according to another embodiments of the inventive concepts, and FIG. 19B a sectional view taken along lines I-I', II-II' and III-III' of FIG. 19A.

Referring to FIGS. 19A and 19B, a plurality of the lower wirings 115w may be disposed on the substrate 100 in the first region 50. The lower wirings 115w may extend parallel to each other along the first direction. The gate electrode 115g may be formed in the second region 60 and disposed on the active region 102 of the substrate 100. The lower wiring 115w may include the same conductive material as the gate electrode 115g. For instance, the metal pattern 110w of the lower wiring 115w may include the same material as the metal gate 110g of the gate electrode 115g. A bottom surface of the lower wiring 115w may be positioned at substantially the same level as a bottom surface of the gate electrode 115g. Thus, a top surface of the metal pattern 110w of the lower wiring 115w may be positioned at substantially the same level as a top surface of the metal gate 110g of the gate electrode 115g.

Diodes 135d' may be disposed on each of the lower wiring 115w. Each of the diodes 135d' may include a seed portion 120d and a bulk portion 133d sequentially stacked. Each of the diodes 135d' may include the first and second doped regions DR1, DR2, which may be formed in the seed portion 120d and the bulk portion 133d', respectively. A top surface of the diodes 135d' may be located at a lower level than a top surface of the interlayer dielectric 130 in the first region 50.

Both sidewalls of the seed portion 120d of the diode 135d' may be aligned with both sidewalls of the lower wiring 115w in a self-alignment manner. Alternatively, in the second direction, a bottom width of the bulk portion 133d' of the diode 135d' may differ from a top width of the seed portion 120d. For instance, the bottom width of the bulk portion 133d' may be less than the top width of the seed portion 120d.

The variable resistance elements VRE may be electrically coupled to top surfaces of the diodes 135d', respectively. The variable resistance element VRE may be electrically coupled to the diode 135d' via the lower contact plug 150. The diode 135d' may have a top surface lower than a top surface of the interlayer dielectric 130. That is, a recess region may be partially formed on the diode 135d'. The lower contact plug 150 may be disposed within the recess region, and the sidewall spacer 147 may be interposed between sidewalls of the lower contact plug 150 and the recess region.

The upper interlayer dielectric 153 may cover the variable resistance elements VRE. The upper wiring 160 may be formed to fill a groove provided in the interlayer dielectric 153. The upper wirings 160 may extend parallel to each other along the second direction and cross the lower wirings 115w. Each of the upper wirings 160 may be electrically coupled to a row of the variable resistance elements VRE arranged along the second direction. The upper wiring 160 may be electrically connected to the variable resistance element VRE via the upper contact plug 155 penetrating the upper interlayer dielectric 153.

According to exemplary embodiments of the inventive concepts, the variable resistance element VRE may be provided as one of those shown in FIGS. 11 through 13, 14A and 14B. The lower contact plug 150 shown in FIG. 19B may be formed to have a structure of the lower contact plug 150a shown in FIG. 14B.

The formation of the diodes 135d' described with reference to FIGS. 17A, 17B, 18A and 18B may include etching the semiconductor line patterns 135a'. Hereinafter, other methods of forming the diodes 135d' will be described with reference to FIGS. 20A, 20B, 21A and 21B FIGS. 20A and 21A are plan views illustrating methods of fabricating a semiconductor memory device according to an exemplary embodiment of the inventive concepts, and FIGS. 20B and 21B are sectional views taken along lines IV-IV' of FIGS. 20A and 21A, respectively.

Figure 20A:
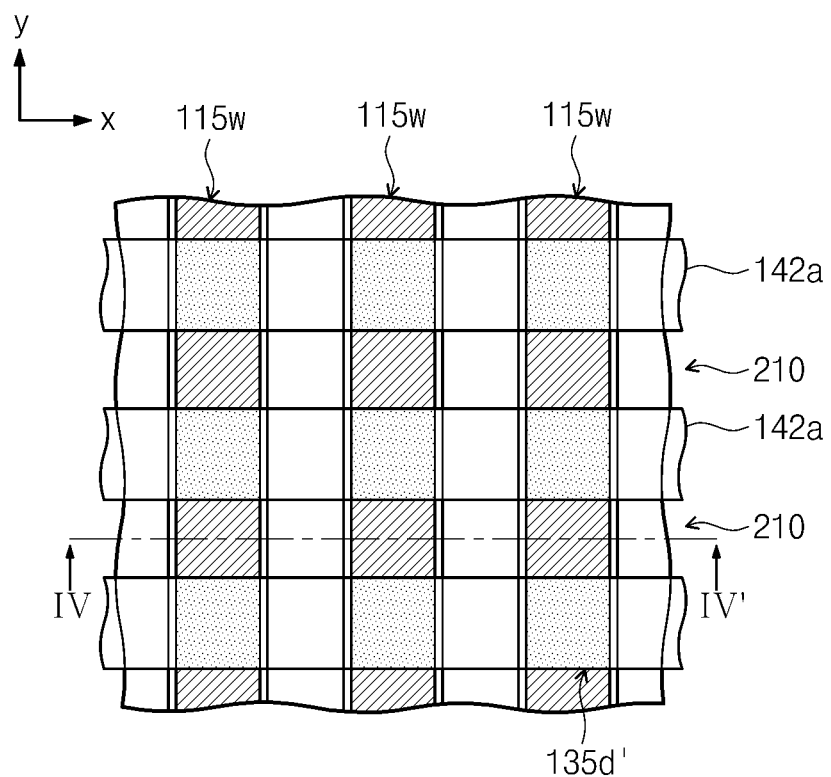
FIGS. 20A and 21A are plan views illustrating methods of fabricating a semiconductor memory device according to a modified example of another exemplary embodiments of the inventive concepts.
Figure 20B:
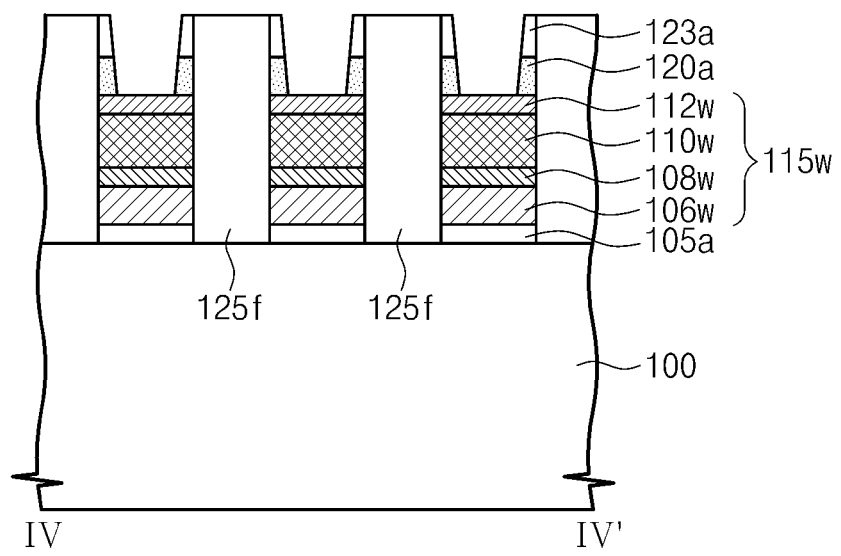
FIGS. 20B and 21B are sectional views taken along lines IV-IV' of FIGS. 20A and 21A, respectively.

Referring to FIGS. 20A and 20B, the semiconductor line pattern 135a' and the interlayer dielectric 130 may be etched using the mask patterns 142a as an etch mask. Thus, the diodes 135d' may be formed under the mask patterns 142a. Further, a trench 210 may be formed between the mask patterns 142a. The trench 210 may extend parallel to the mask patterns 142a. During the formation of the trench 210, the spacer patterns 125f disposed between the lower wirings 115w may be used as an etch stop layer.

Figure 21A:
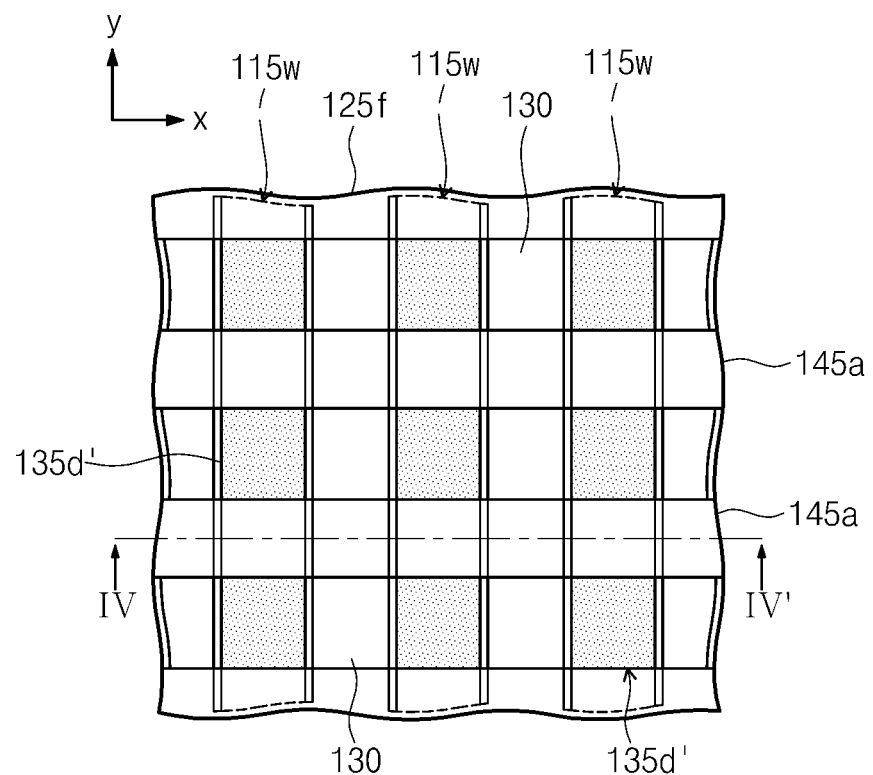
Figure 21B:
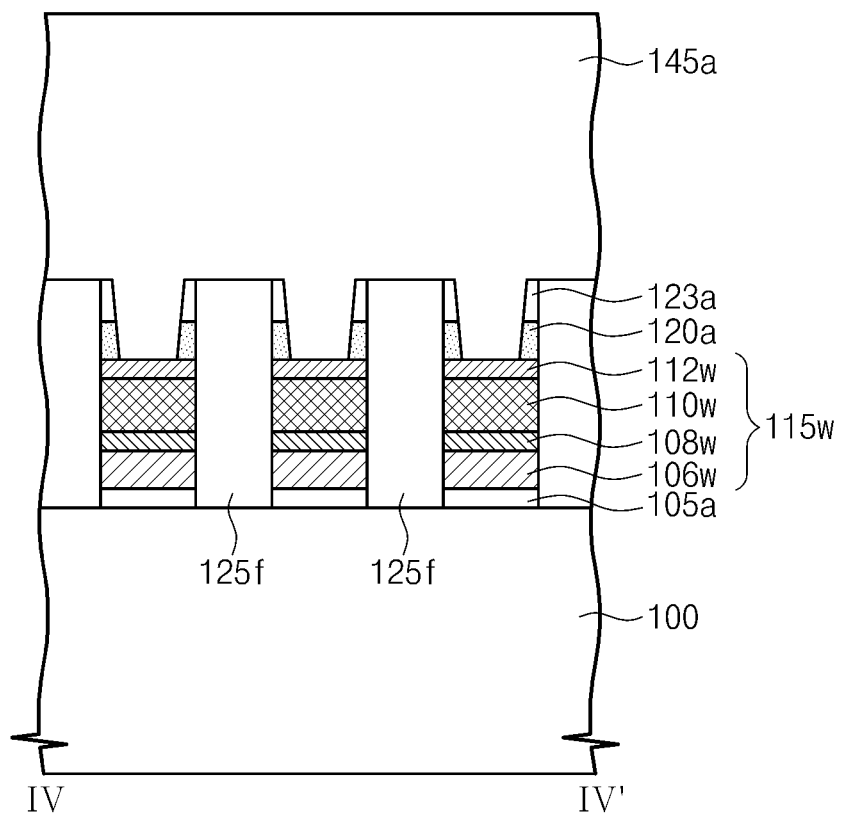

Referring to FIGS. 21A and 21B, the mask patterns 142a may be removed, and a gap-fill insulating layer may be formed to fill the trenches 210. Thereafter, the gap-fill insulating layer may be planarized to expose the diodes 135d', thereby forming a gap-fill insulating pattern 145a filling the trench. The gap-fill insulating pattern 145a may have a line shape extending along the second direction. The gap-fill insulating pattern 145a may be formed of substantially the same material as the gap-fill insulating pattern 145 of FIGS. 18A and 18B. The subsequent processes may be performed in the same manner as one of the embodiments described with reference to FIGS. 1B through 9B or FIGS. 18A and 18B.

Semiconductor memory devices according to the inventive concepts can be used to realize various types of semiconductor packages. For example, semiconductor memory devices according to the inventive concepts can be packaged with methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multichip package (MCP), wafer-level fabricated package (WFP), wafer-level processed stack package (WSP).

Package devices provided with semiconductor memory devices according to the inventive concepts may further include other electronic devices, such as a controller controlling the semiconductor memory device and/or a logic device.

According to exemplary embodiments of the inventive concepts, the lower wirings in the first region may include the same conductive material as the gate electrode in the second region. Thus, the lower wirings may be formed to exhibit low resistivity. As a result, it is possible to realize a semiconductor memory device with a fast operating speed. In addition, the diodes may be disposed on the lower wiring, and thus, it is possible to reduce an occupying area of a unit memory cell including the diode and the variable resistance element. As a result, it is possible to realize the semiconductor memory device with an increased integration density.

While exemplary embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
a substrate including a first region and a second region;
a lower wiring disposed on the substrate in the first region;
a wiring-insulating layer interposed between the lower wiring and the substrate;
a diode disposed on the lower wiring, the diode having a seed portion and a bulk portion sequentially stacked;
a variable resistance element electrically coupled to the diode;
a gate electrode comprising a conductive material and disposed on the substrate in the second region, the lower wiring including substantially the same conductive material as the gate electrode; and
a capping semiconductor pattern disposed on the gate electrode; and
a gate insulating layer interposed between the gate electrode and the substrate,
wherein the conductive material of the lower wiring connected to the diode is at a same level above the substrate as the conductive material of the gate electrode, and
wherein the capping semiconductor pattern comprises substantially the same semiconductor material as a semiconductor material included in the seed portion.

2. The semiconductor memory device of claim 1, wherein a bottom surface of the lower wiring is located at substantially the same level as a bottom surface of the gate electrode.

3. The semiconductor memory device of claim 1, wherein the wiring-insulating layer is formed of substantially the same material as the gate insulating layer.

4. The semiconductor memory device of claim 1,
wherein the diode includes a first doped region and a second doped region forming a PN junction, and
wherein the first doped region of the diode is formed in at least the speed portion coupled to the lower wiring.

5. The semiconductor memory device of claim 1, wherein the gate electrode comprises a metal gate, and the lower wiring comprises a metal pattern including substantially the same metal as the metal gate.

6. The semiconductor memory device of claim 5, wherein a top surface of the metal pattern disposed under the diode is located at substantially the same level as a top surface of the metal gate.

7. The semiconductor memory device of claim 5, wherein the gate electrode further comprises a lower barrier gate interposed between the metal gate and gate insulating layer and an upper harrier gate disposed on the metal gate,
wherein the lower wiring further comprises a lower barrier pattern interposed between the metal pattern and wiring-insulating layer and an upper barrier pattern dispose on the metal pattern, and
wherein the lower harrier gate is formed of substantially the same material as the lower barrier pattern, and the upper barrier gate is formed of substantially the same material as the upper barrier pattern.

8. The semiconductor memos device of claim 1, the diode has a tetragonal top surface when viewed from a plan view.

9. The semiconductor memory device of claim 1, wherein the diode has both sidewalls self-aligned with both sidewalls of the lower wiring, respectively.

10. The semiconductor memory device of claim 1, further comprising an upper wiring electrically coupled to a top surface of the variable resistance element and crossing the lower wiring.

11. A semiconductor memory device comprising:
a transistor region formed on a semiconductor substrate; and
a memory cell region formed on the semiconductor substrate,
wherein the transistor region includes a gate electrode comprising a gate conductive layer disposed at a predetermined level from the semiconductor substrate,
wherein a capping semiconductor pattern is disposed on the gate electrode, and
wherein the memory cell region includes:
a plurality of lower wirings spaced apart from each other, each of the lower wirings extending in a first direction, comprising conductive metals substantially the same material as the gate conductive layer and disposed at the same predetermined level from the semiconductor substrate as the gate conductive layer of the gate electrode;

pluralities of diodes on each of the lower wirings, each diode having a seed portion and a bulk portion sequentially stacked, and each diode spaced apart from an adjacent diode in the first direction on a respective lower wiring;

a lower contact plug on each of the diodes;

a variable resistance element on each lower contact plug;

an upper contact plug on each variable resistance element; and a plurality of upper wirings spaced apart from each other, each of the upper wirings extending in a second direction substantially perpendicular to the first direction and contacting one of the upper contact plugs associated with each of the lower wirings, such that the variable resistance element and associated diode form a memory cell at a plan view intersection of an upper wiring and a lower wiring, and wherein the capping semiconductor pattern comprises substantially a same semiconductor material as a semiconductor material included in the seed portion.

12. The semiconductor memory device of claim 11, wherein the gate conductive layer and the lower wirings both comprise a first barrier layer, a metal layer, and a second barrier layer sequentially stacked, the metal layer comprising a metal having a low resistivity, the first barrier layer comprising conductive material configured to prevent metal atoms in the metal layer from diffusing toward the semiconductor substrate, the second barrier layer comprising a conductive material configured to prevent metal atoms in the metal layer from diffusing away from the semiconductor substrate.

13. The semiconductor memory device of claim 11, wherein each diode comprises:

a first doping region in contact with a respective lower wiring layer and doped with dopants of a first conductivity type;

a second doping region stacked on the first doping region and doped with dopants of a second conductive type, wherein the first dopant region and the second dopant region form a diode PN junction.

14. The semiconductor memory device of claim 13, wherein each diode enlargingly tapers from an end of the first doping region in contact with the lower wiring layer to an end of the second doping region distal from the first doping region.

15. The semiconductor memory device of claim 11, wherein the variable resistance element comprises a variable resistance material whose resistance or crystalline structure can be reversibly changed by a signal applied to the variable resistance element such that the variable resistance element stores logical data.

* * * * *